(12) United States Patent
Yasuda

(10) Patent No.: US 8,378,426 B2
(45) Date of Patent: Feb. 19, 2013

(54) SEMICONDUCTOR MEMORY DEVICE AND FABRICATION PROCESS THEREOF

(75) Inventor: Makoto Yasuda, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 464 days.

(21) Appl. No.: 12/068,692

(22) Filed: Feb. 11, 2008

(65) Prior Publication Data

US 2008/0203493 A1 Aug. 28, 2008

(30) Foreign Application Priority Data

Feb. 22, 2007 (JP) ................................. 2007-042498

(51) Int. Cl.
*H01L 21/70* (2006.01)
(52) U.S. Cl. ........ 257/377; 257/233; 257/314; 257/344; 257/E21.661; 438/199; 438/200
(58) Field of Classification Search ........... 257/E21.661, 257/E27.098, 756, 369–377, 233, 314, 344; 438/200, 199
See application file for complete search history.

(56) References Cited

U.S. PATENT DOCUMENTS

| | | | |
|---|---|---|---|
| 5,126,279 A | | 6/1992 | Roberts |
| 5,770,497 A | | 6/1998 | Wu et al. |
| 5,831,306 A | * | 11/1998 | Gardner et al. ............... 257/344 |
| 5,841,168 A | * | 11/1998 | Gardner et al. ............... 257/344 |
| 6,008,080 A | * | 12/1999 | Chuang et al. ................. 438/200 |
| 6,051,881 A | * | 4/2000 | Klein et al. .................... 257/756 |
| 7,042,050 B2 | * | 5/2006 | Tsujii ............................ 257/344 |
| 7,064,395 B2 | | 6/2006 | Minami et al. |
| 7,138,312 B2 | | 11/2006 | Minami et al. |
| 7,414,292 B2 | | 8/2008 | Ema et al. |
| 2002/0005543 A1 | * | 1/2002 | Di Pede et al. ............... 257/314 |
| 2004/0252546 A1 | | 12/2004 | Liaw |
| 2006/0108613 A1 | * | 5/2006 | Song et al. .................... 257/233 |

FOREIGN PATENT DOCUMENTS

| | | |
|---|---|---|
| JP | 7-131003 A | 5/1995 |
| JP | 7-169858 A | 7/1995 |
| JP | 2002-190534 A | 7/2002 |
| JP | 2002-329798 A | 11/2002 |
| JP | 2005-72185 A | 3/2005 |
| JP | 2005-268620 A | 9/2005 |
| JP | 2006-41035 A | 2/2006 |
| WO | 2004-112139 A1 | 12/2004 |

OTHER PUBLICATIONS

Partial European Search Report dated Sep. 8, 2010, issued in corresponding European Patent Application No. 08101463.1. Japanese Office Action dated May 22, 2012, issued in corresponding Japanese Patent Application No. 2007-042498, with English translation (6 pages).

* cited by examiner

*Primary Examiner* — Jerome Jackson, Jr.
*Assistant Examiner* — Fang-Xing Jiang
(74) *Attorney, Agent, or Firm* — Westerman, Hattori, Daniels & Adrian, LLP

(57) ABSTRACT

A SRAM includes a first CMOS inverter of first and second MOS transistors connected in series, a second CMOS inverter of third and fourth MOS transistors connected in series and forming a flip-flop circuit together with the first CMOS inverter, and a polysilicon resistance element formed on a device isolation region, each of the first and third MOS transistors is formed in a device region of a first conductivity type and includes a second conductivity type drain region at an outer side of a sidewall insulation film of the gate electrode with a larger depth than a drain extension region thereof, wherein a source region is formed deeper than a drain extension region, the polysilicon gate electrode has a film thickness identical to a film thickness of the polysilicon resistance element, the source region and the polysilicon resistance element are doped with the same dopant element.

4 Claims, 27 Drawing Sheets

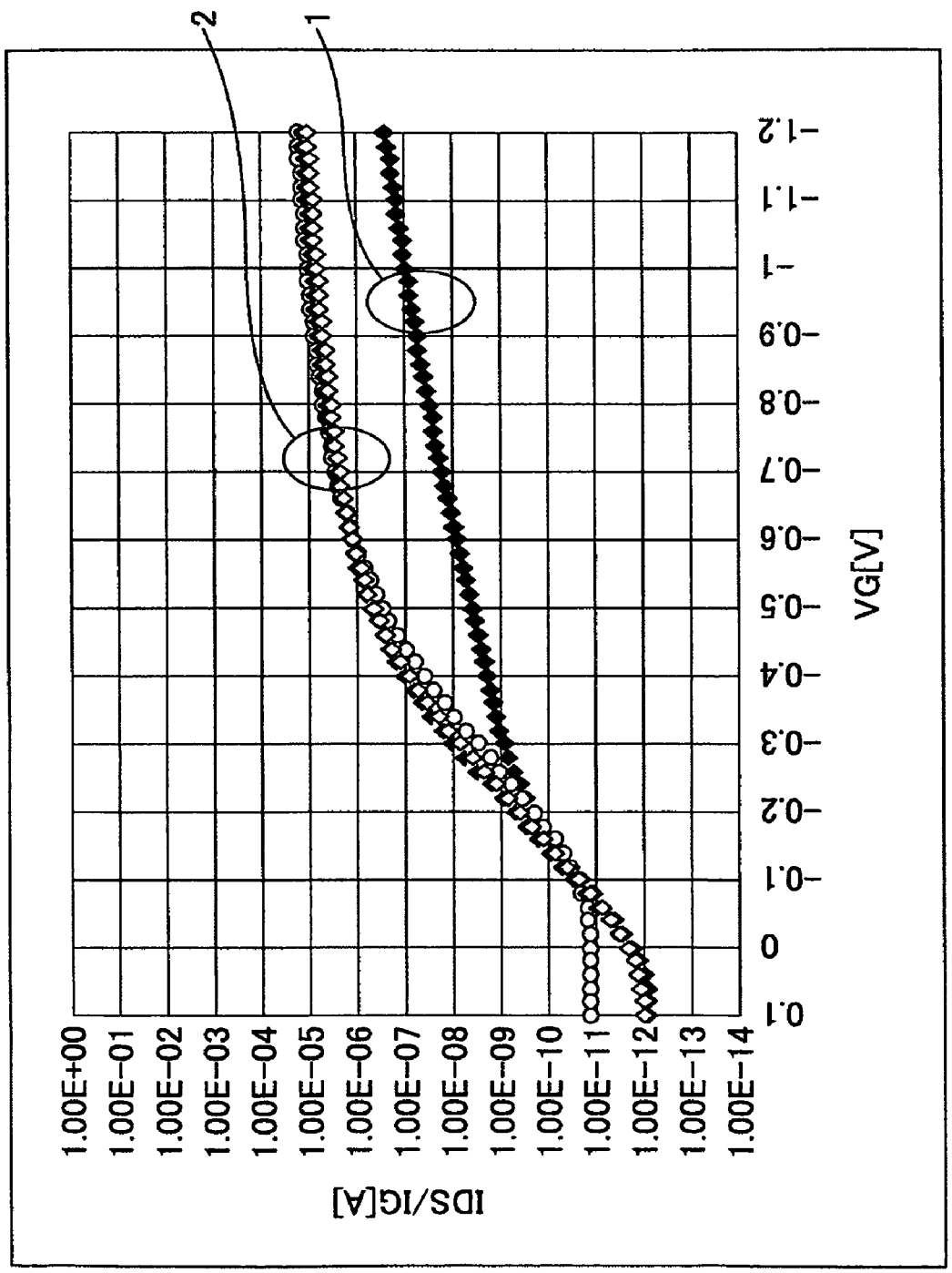

$|V_{GS}'| > |V_{GS}|$

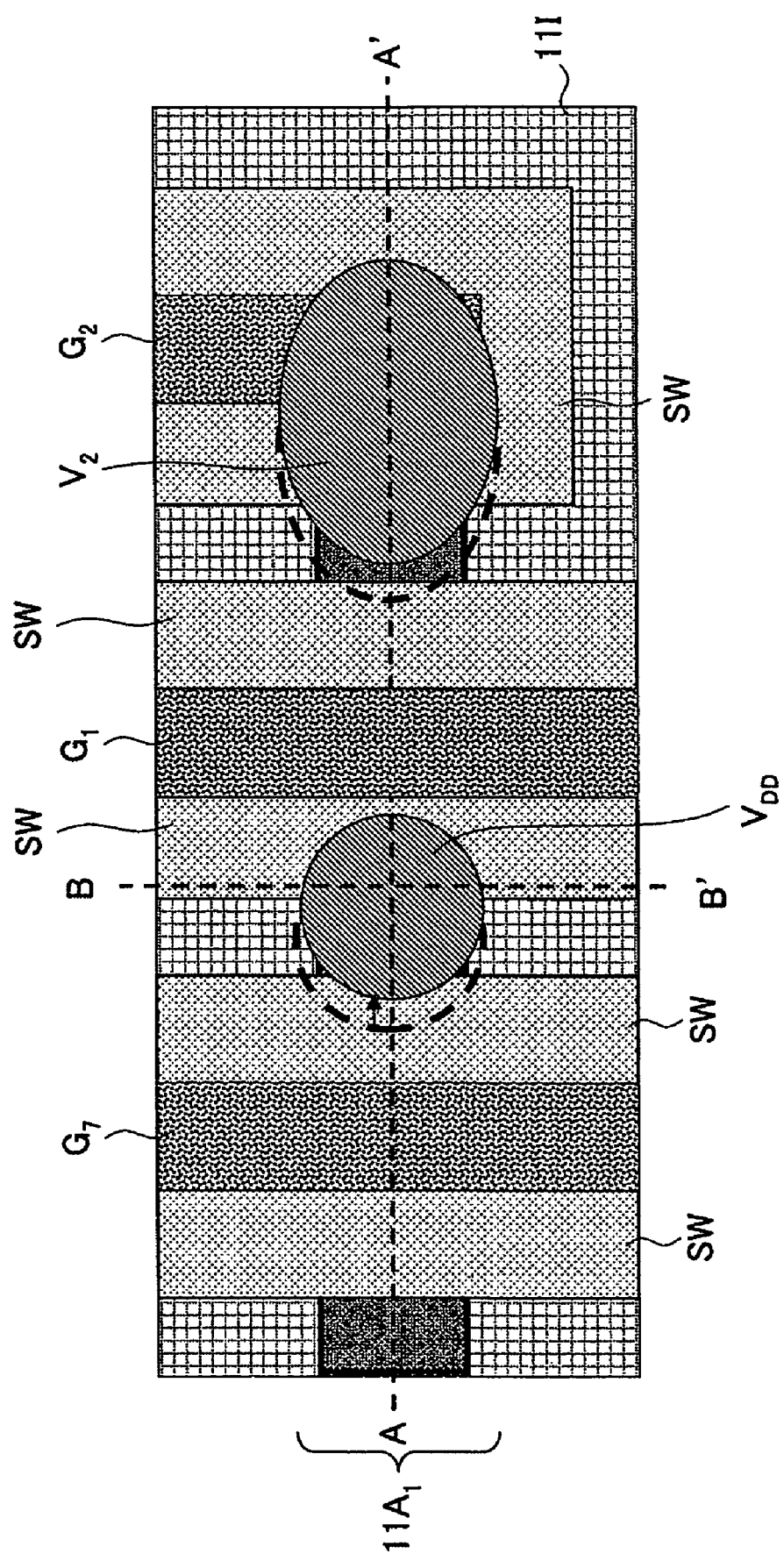

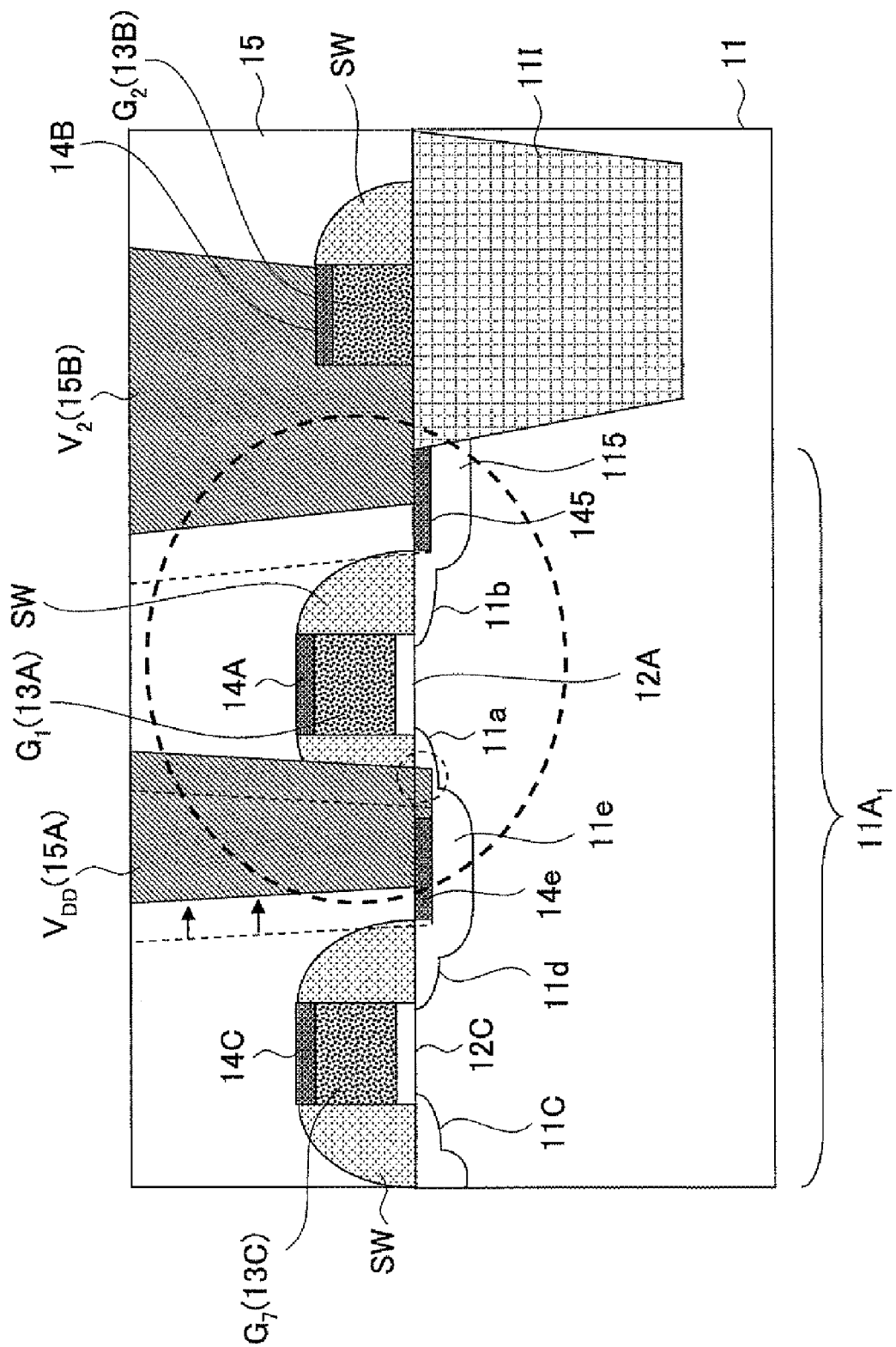

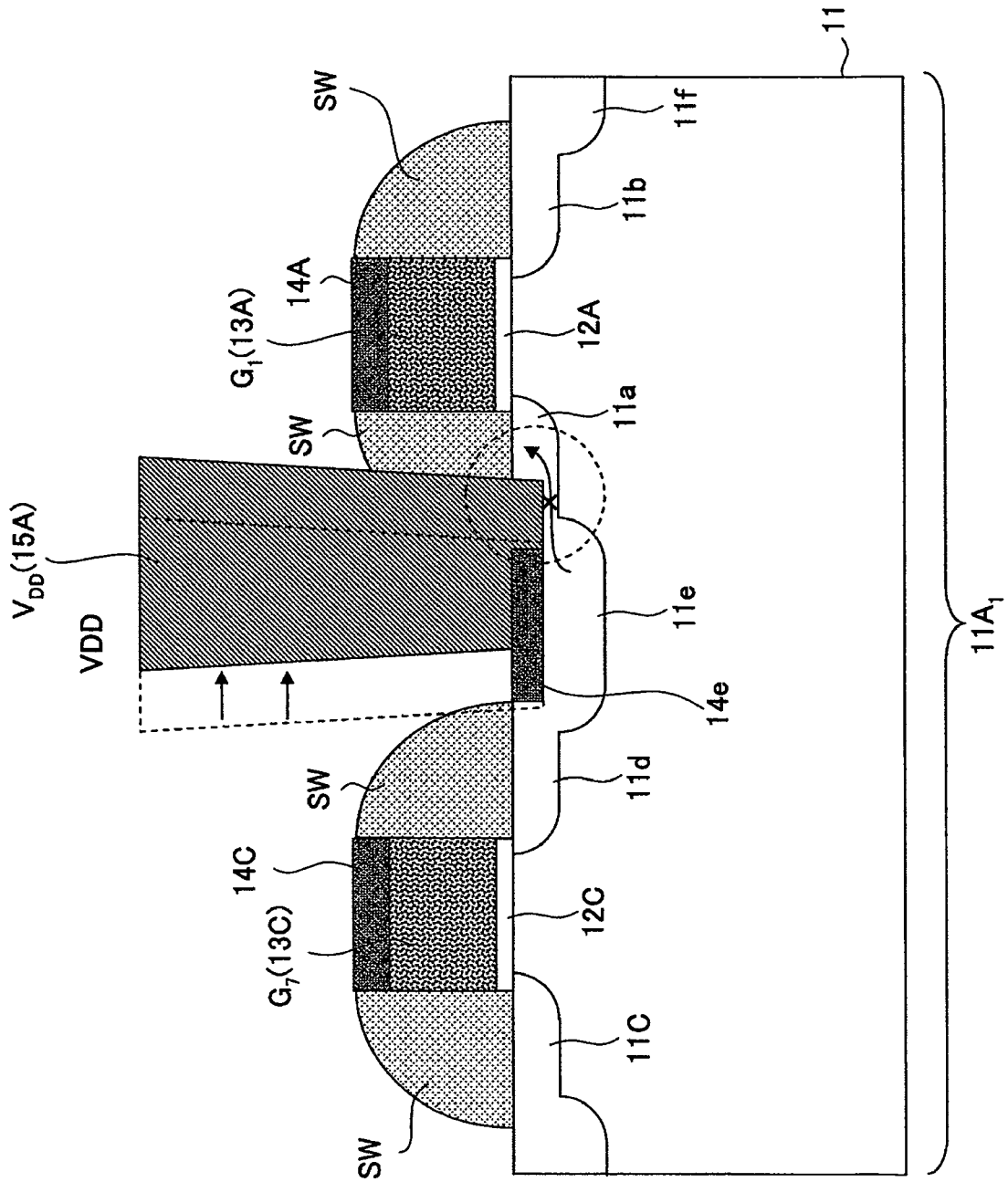

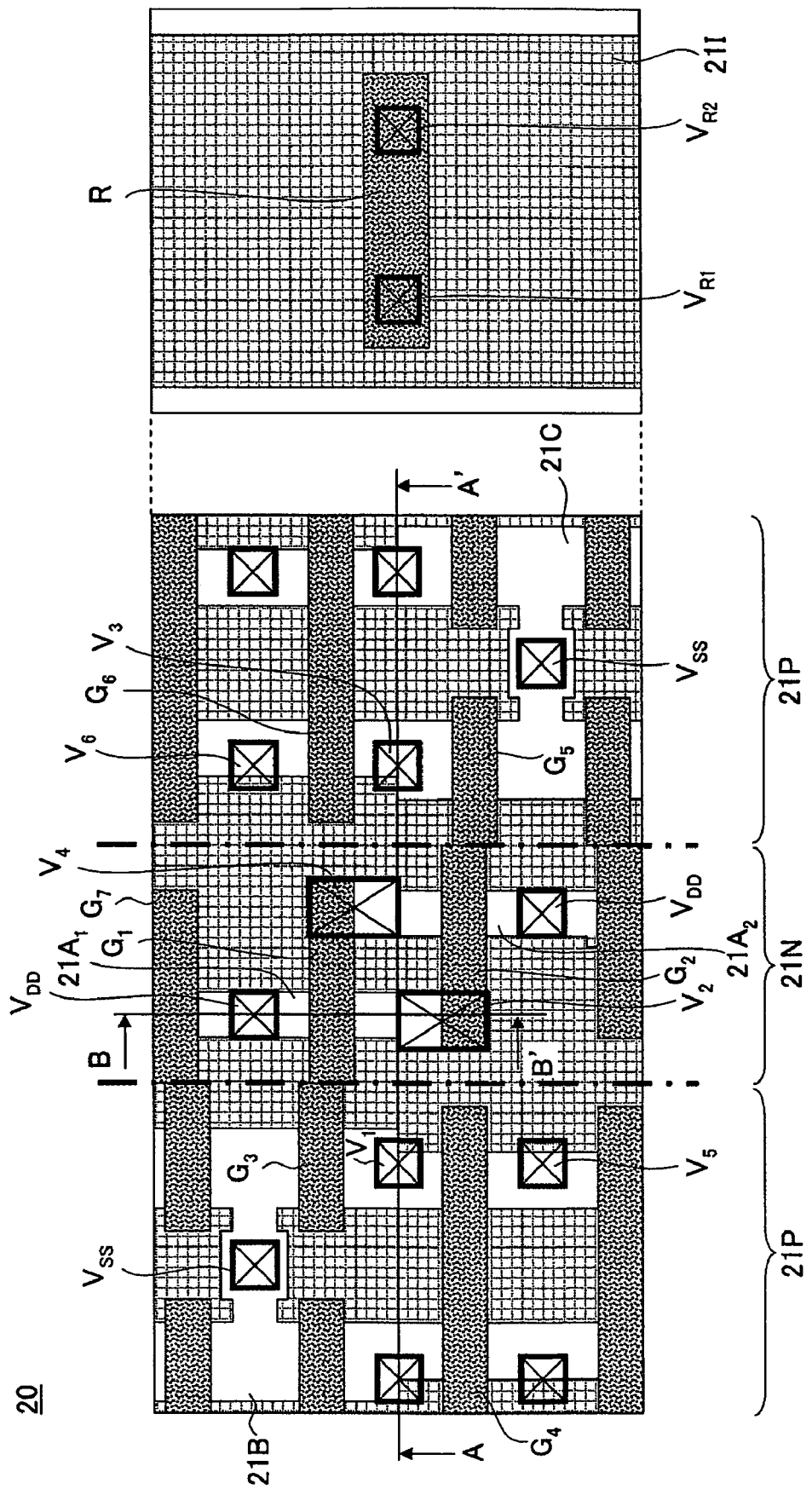

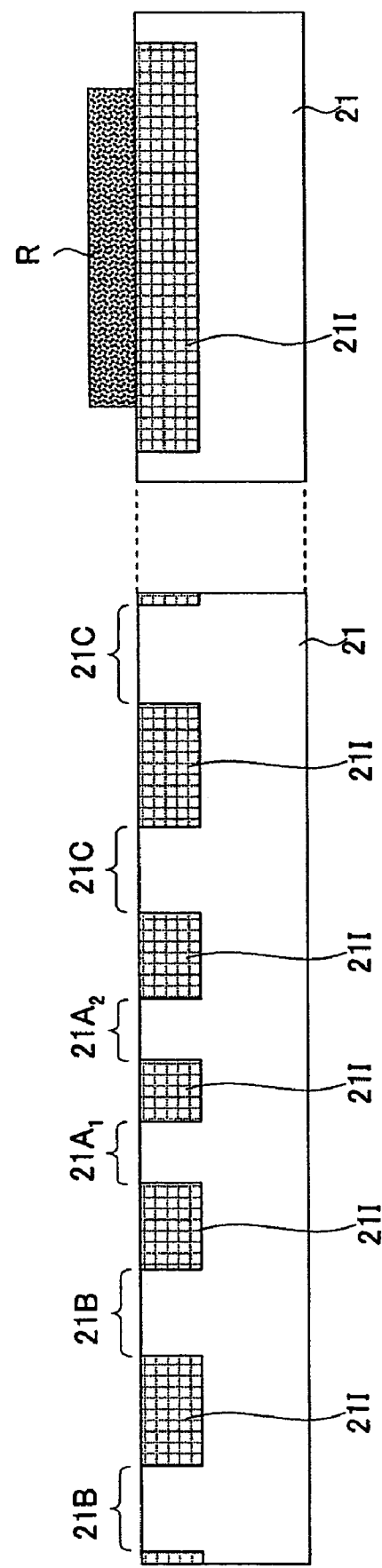

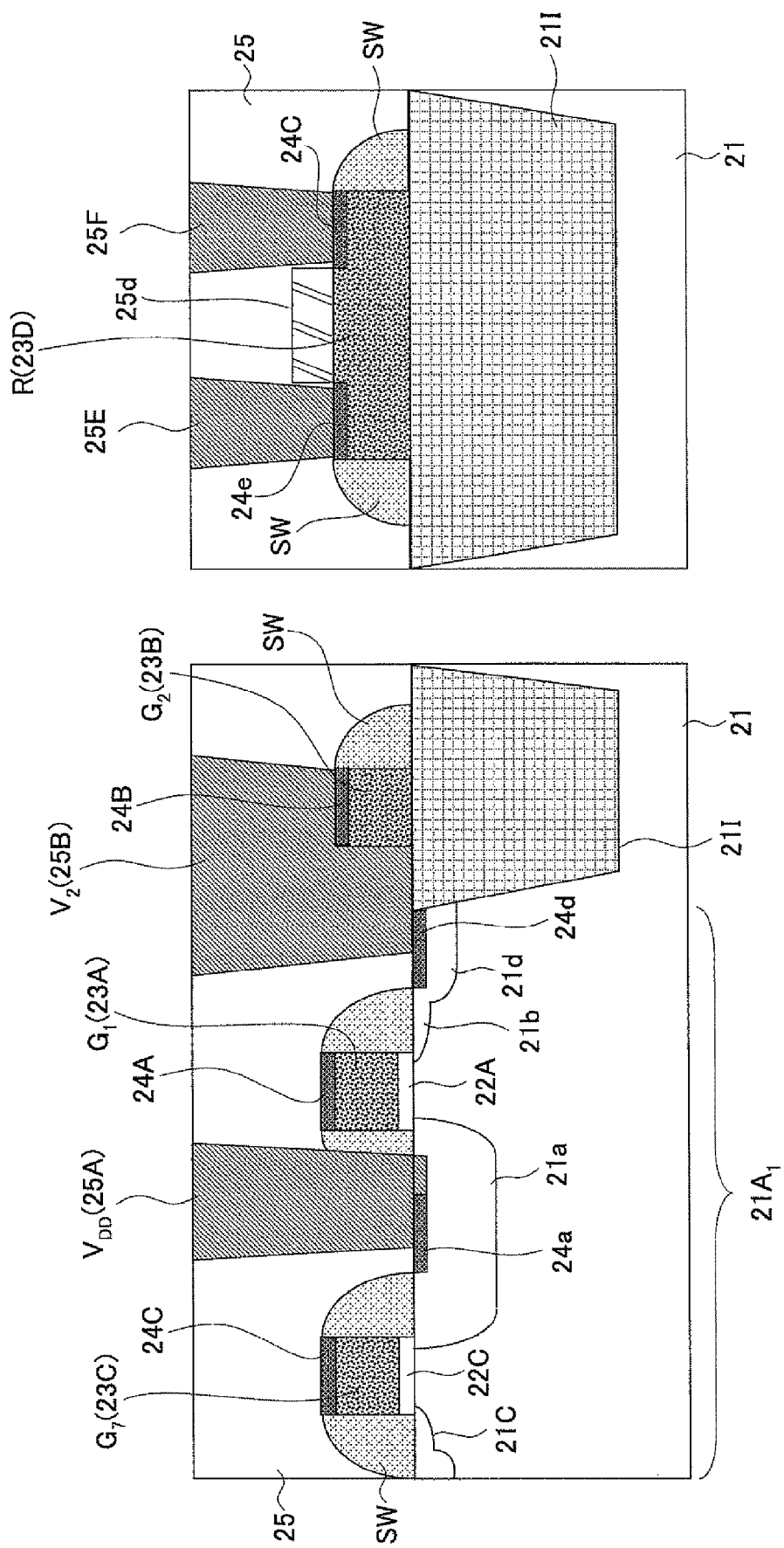

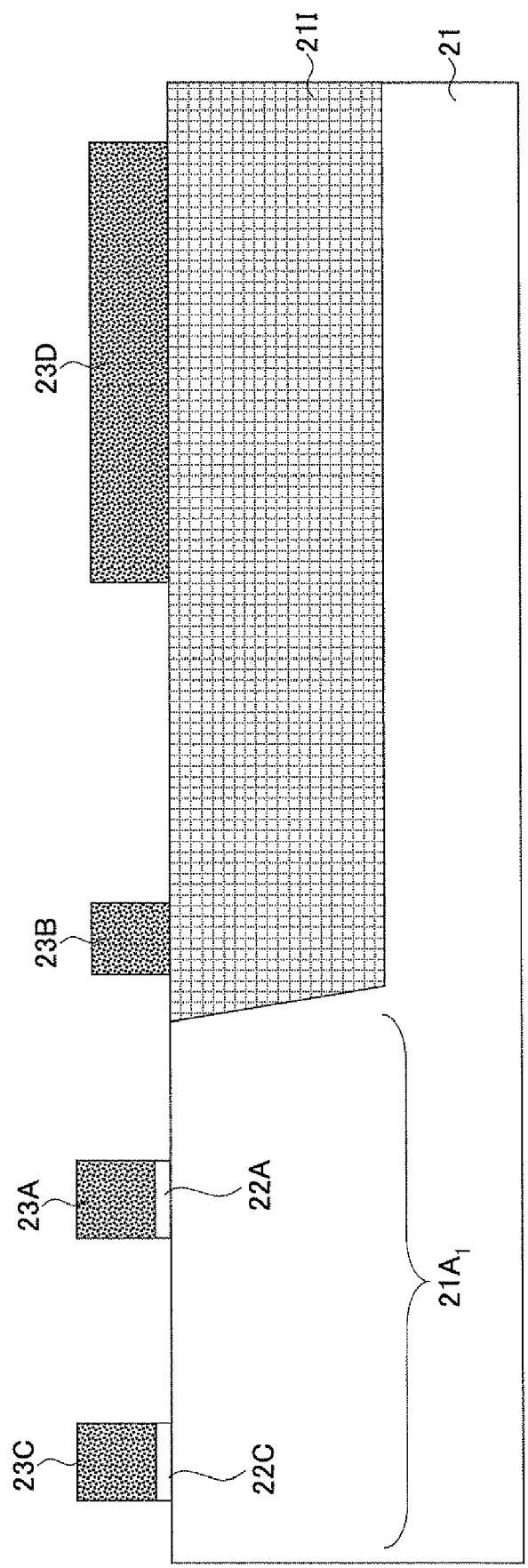

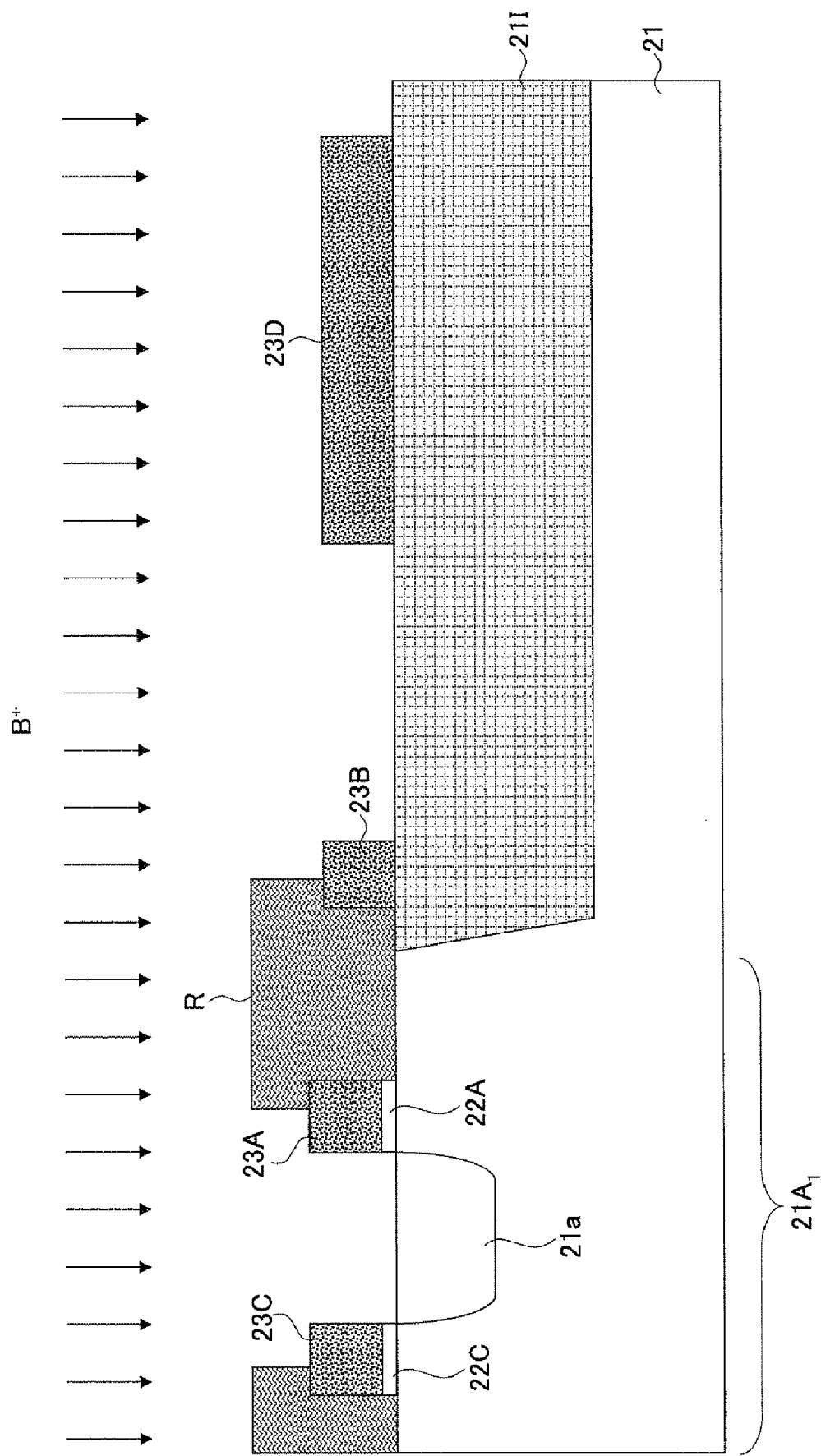

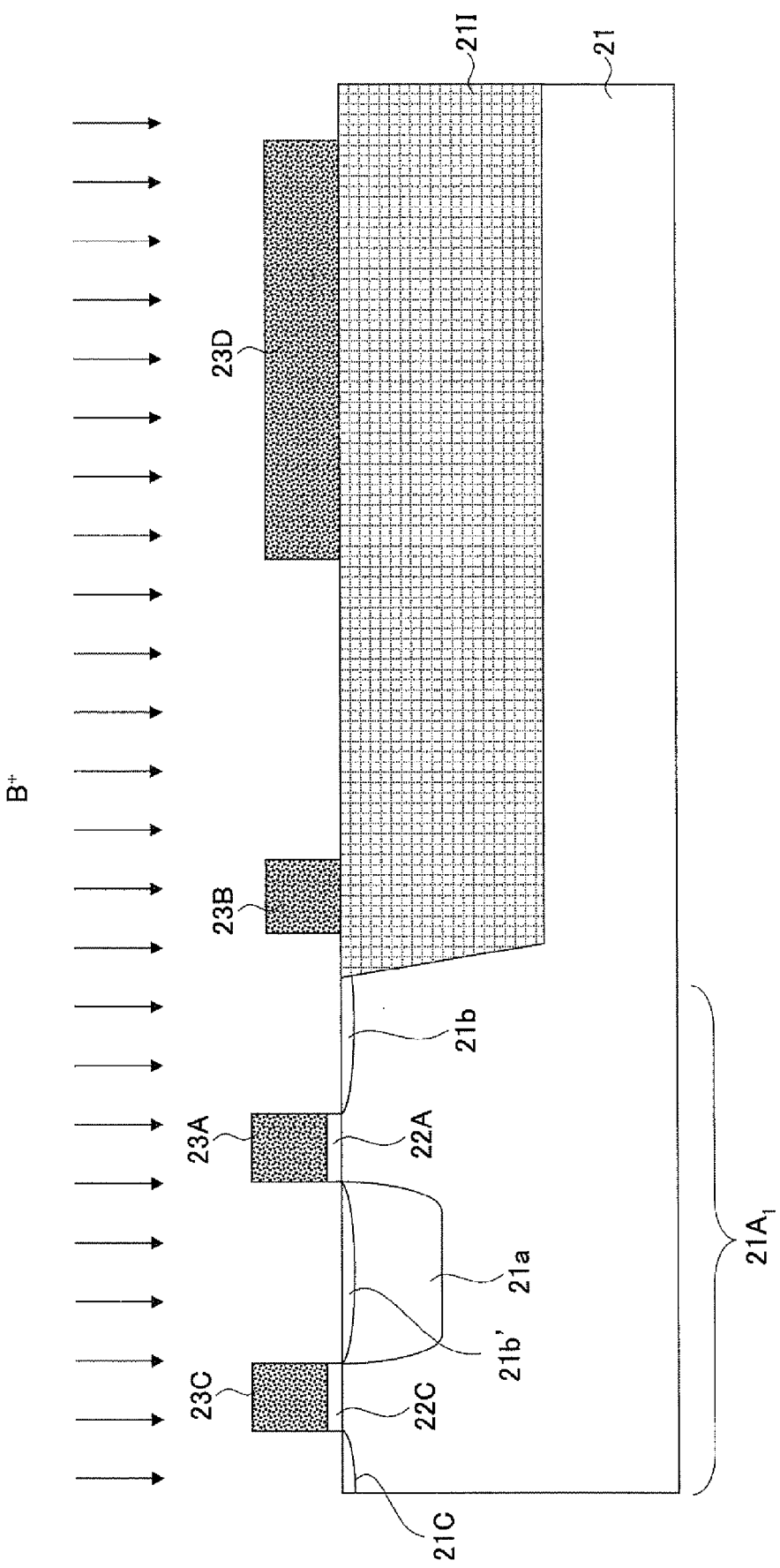

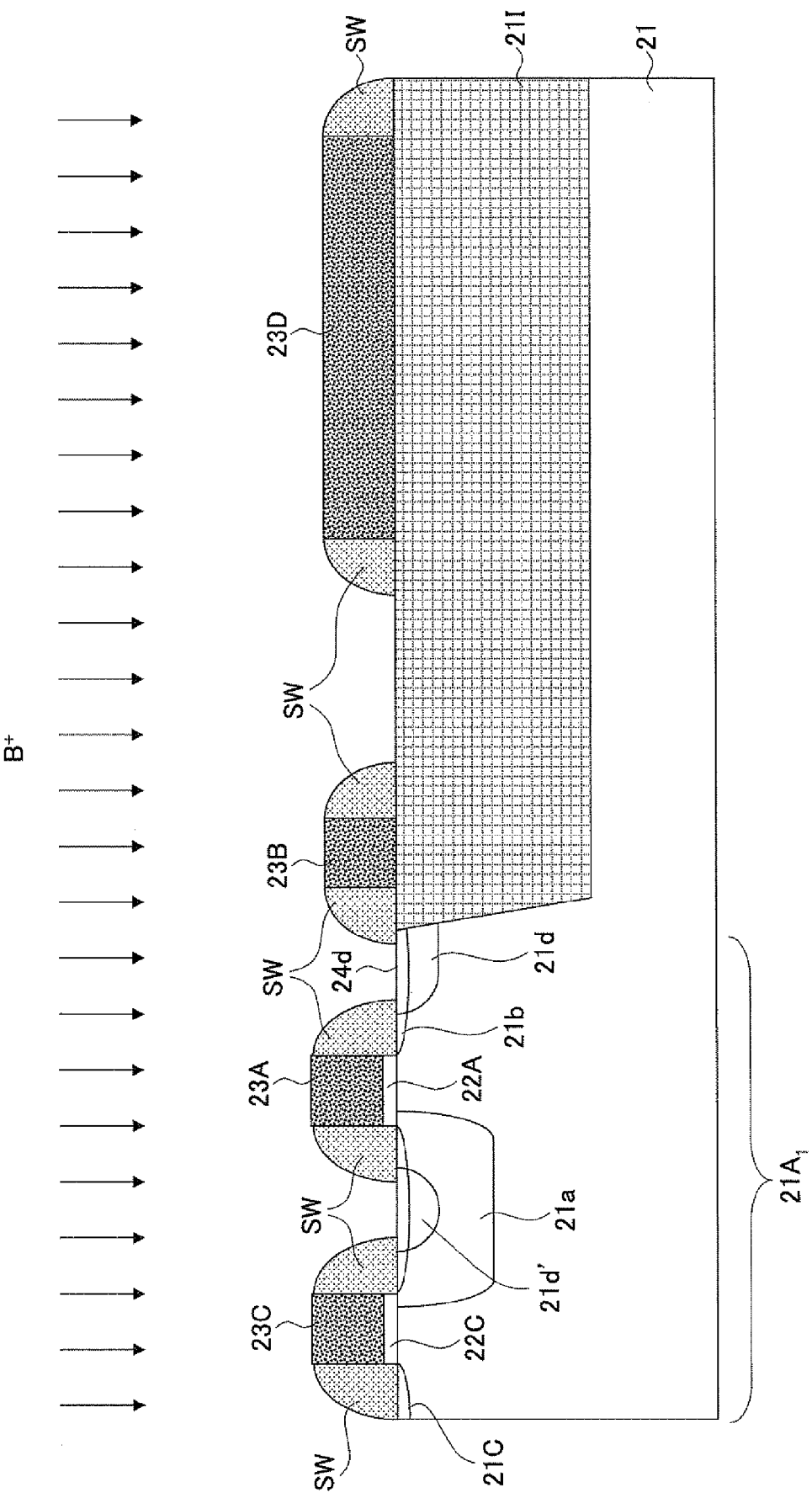

$W_1 > S_2$

SEMICONDUCTOR MEMORY DEVICE AND FABRICATION PROCESS THEREOF

CROSS-REFERENCE TO RELATED APPLICATION

The present application is based on Japanese priority application No. 2007-042498 filed on Feb. 22, 2007, the entire contents of which are hereby incorporated by reference.

BACKGROUND OF THE INVENTION

The present invention generally relates to semiconductor devices and more particularly to a semiconductor memory device that includes a static random access memory.

A static random access memory (referred to hereinafter as SRAM) is a high-speed semiconductor memory device including a transfer transistor selected by a word line and two CMOS inverters forming together a flip-flop connection, wherein each of the CMOS inverters is connected to a corresponding bit line via a corresponding transfer transistor. SRAMs are used extensively in high-speed logic circuit devices together with high-speed logic elements such as CMOS circuit.

FIG. 1 is an equivalent circuit diagram of a typical SRAM 10.

Referring to FIG. 1, the SRAM 10 includes a first CMOS inverter $I_1$ in which a first load transistor $LT_1$ and a first driver transistor $DT_1$ are connected in series, a second CMOS inverter $I_2$ in which a second load transistor $LT_2$ and a second driver transistor $LD_2$ are connected in series. The first CMOS inverter $I_1$ and the second CMOS inverter $I_2$ form together a flip-flop circuit FF, wherein a node $N_1$ connecting the first load transistor $LT_1$ and the first driver transistor $DT_1$ with each other, is connected to a first bit line BL via a first transfer transistor $TF_1$, while the first transfer transistor $TF_1$ is controlled by a word line WL. Similarly, a node $N_2$ connecting the second load transistor $LT_2$ and the second driver transistor $DT_2$ with each other, is connected to a first bit line /BL via a second transfer transistor $TF_2$ controlled by the word line WL.

In SRAMs of such a construction, current drivability of the load transistors $LT_1$ and $LT_2$ that drive the driver transistors $DT_1$ and $DT_2$ is extremely important for attaining high-speed operation of the SRAM.

Patent Reference 1 Japanese Laid-Open Patent Application 2006-41035
Patent Reference 2 Japanese Laid-Open Patent Application 7-131003
Patent Reference 3 Japanese Laid-Open Patent Application 7-169858
Patent Reference 4 Japanese Laid-Open Patent Application 2002-329798
Patent Reference 5 Japanese Laid-Open Patent Application 2002-190534

SUMMARY

According to an aspect of an embodiment, a semiconductor memory device includes: a semiconductor substrate; a first CMOS inverter comprising first and second MOS transistors having respective, mutually different channel conductivity types and connected in series at a first node on said semiconductor substrate; a second CMOS inverter comprising third and fourth MOS transistors having respective, mutually different channel conductivity types and connected in series at a second node on said semiconductor substrate, said second CMOS inverter forming, together with said first CMOS inverter, a flip-flop circuit; a first transfer transistor provided on said semiconductor substrate between a first bit line and said first node, said first transfer transistor having a first gate electrode connected to a word line and driven by a selection signal on said word line; a second transfer transistor provided on said semiconductor substrate between a second bit line and said second node, said second transfer transistor having a second gate electrode connected to said word line and driven by a selection signal on said word line; a polysilicon resistance element formed on a device isolation region on said semiconductor substrate, each of said first and third MOS transistors being formed in a device region of a first conductivity type defined in said semiconductor substrate by said device isolation region, each of said first and third MOS transistors including: a polysilicon gate electrode formed on said semiconductor substrate via a gate insulation film and having gate sidewall insulation films at respective sidewall surfaces thereof; a second conductivity type source region formed in said semiconductor substrate at a first side of said polysilicon gate electrode such that an end part of said second conductivity type source region invades into a part of said semiconductor substrate right underneath said polysilicon gate electrode; a second conductivity type drain extension region formed in a surface part of said semiconductor substrate at a second side opposite to said first side of said polysilicon gate electrode such that an end part of said second conductivity type drain extension region invades into a part of said semiconductor substrate right underneath said polysilicon gate electrode; and a second conductivity type drain region formed in said semiconductor substrate at an outer side of said gate sidewall insulation film of said second side in overlapping with said drain extension region with a depth larger than a depth of said second conductivity type drain extension region, said source region being formed deeper than said drain extension region, said polysilicon gate electrode having a film thickness identical to a film thickness of said polysilicon resistance element, said source region and said polysilicon resistance element being doped with the same dopant element.

According to another aspect of an embodiment, a method for fabricating a semiconductor memory device, said semiconductor memory device including: a first CMOS inverter comprising first and second MOS transistors having respective, mutually opposite channel conductivity types and connected in series at a first node on a semiconductor substrate; a second CMOS inverter comprising third and fourth MOS transistors having respective, mutually opposite channel conductivity types and connected in series at a second node on said semiconductor substrate, said second CMOS inverter forming, together with said first CMOS inverter, a flip-flop circuit; a first transfer transistor provided on said substrate between a first bit line and said first node, said first transfer transistor having a first gate electrode connected to a word line and driven by a selection signal on said word line; a second transfer transistor provided on said substrate between a second bit line and said second node, said second transfer transistor having a second gate electrode connected to said word line and driven by a selection signal on said word line; and a polysilicon resistance element formed on a device isolation region on said semiconductor substrate, said method includes the steps of: forming a first polysilicon pattern constituting a gate electrode of said first MOS transistor on a device region of a first conductivity type defined on said semiconductor substrate by said device isolation region via a gate insulation film, simultaneously with a second polysilicon pattern constituting said polysilicon resistance element on said device isolation region, as a result of patterning of a polysilicon film; introducing an impurity element of said second conductivity type into said device region at a first side of said first polysilicon pattern and further into said second polysilicon pattern such that there is formed a source region of said second conductivity type at said first side of said first polysilicon pattern in said device region and doping said second polysilicon pattern with said impurity element; introducing an impurity element of said second conductivity type into said device region at said first side and at a second side opposite to said first side of said first polysilicon pattern and further into said second polysilicon pattern such that there is formed a drain extension region in a surface part of said device region at said second side of said first polysilicon pattern with an impurity concentration lower than an impurity concentration of said source region and increasing an impurity concentration of said second polysilicon pattern; forming sidewall insulation films on respective sidewall surfaces of said first and second polysilicon patterns; and introducing an impurity element of said second conductivity type into said device region and further into said second polysilicon pattern while using said first polysilicon pattern and said sidewall insulation films at said first side and said second side of said first polysilicon pattern as a mask such that there are formed drain regions of said second conductivity type at respective outer parts of said sidewall insulation films of said first side and said second side of said first polysilicon pattern and such that an impurity concentration of said second polysilicon pattern is increased.

According to further another aspect of an embodiment, a semiconductor memory device includes: a semiconductor substrate; a first CMOS inverter comprising first and second MOS transistors having respective, mutually opposite channel conductivity types and connected in series at a first node on said semiconductor substrate; a second CMOS inverter comprising third and fourth MOS transistors having respective, mutually opposite channel conductivity types and connected in series at a second node on said semiconductor substrate, said second CMOS inverter forming, together with said first CMOS inverter, a flip-clop circuit; a first transfer transistor provided on said semiconductor substrate between a first bit line and said first node, said first transfer transistor having a first gate electrode connected to a word line and driven by a selection signal on said word line; a second transfer transistor provided on said semiconductor substrate between a second bit line and said second node, said second transfer transistor having a second gate electrode connected to said word line and driven by a selection signal on said word line, said first MOS transistor being formed in a first device region of a band shape formed on said semiconductor substrate by a device isolation region, said first MOS transistor having a gate electrode of a first polysilicon pattern traversing said first device region, said third MOS transistor being formed in a second device region of a band shape formed on said semiconductor substrate by said device isolation region, said third MOS transistor having a gate electrode of a second polysilicon pattern traversing said second device region, said first polysilicon pattern being connected to a first end part of said second device region by a first via-plug, said second polysilicon pattern being connected to a first end of said first device region by a second via-plug, a third via-plug being in contact with a part of said first device region at a side opposite to a side of said first via-plug with regard to said first polysilicon pattern as a power contact, a fourth via-plug being in contact to a part of said second device region at a side opposite to said second via-plug with regard to said second polysilicon pattern as a power contact, said third via-plug having a diameter larger than a width of said first device region, said fourth via-plug having a diameter larger than a width of said second device region, said third via-plug being offset from a central line of said first device region, said fourth via-plug being offset from a central line of said second device region.

BRIEF DESCRIPTION OF THE DRAWINGS

FIG. 3 is a diagram explaining the problems to be solved;

FIGS. 5A-5C are further diagrams explaining the problems to be solved;

FIG. 6 is a further diagram explaining the problems to be solved;

FIGS. 7A and 7B are diagrams explaining the construction of an SRAM according to a first embodiment;

FIG. 8 is a cross-sectional diagram showing the construction of the SRAM of FIGS. 7A and 7B in detail;

FIGS. 9A-9H are diagrams explaining the fabrication process of an SRAM of FIG. 8;

DETAILED DESCRIPTION OF THE PREFERRED EMBODIMENT

Figure 1:
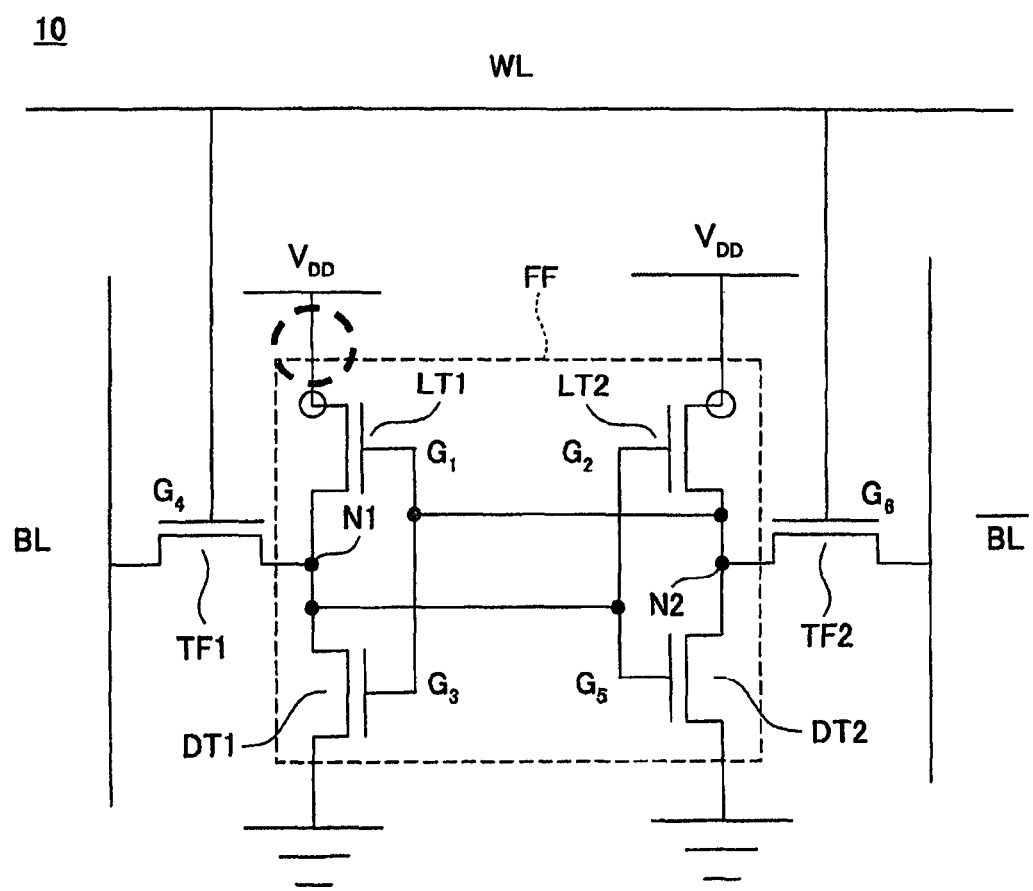
FIG. 1 is a diagram showing an equivalent circuit diagram of SRAM.
Figure 2A:
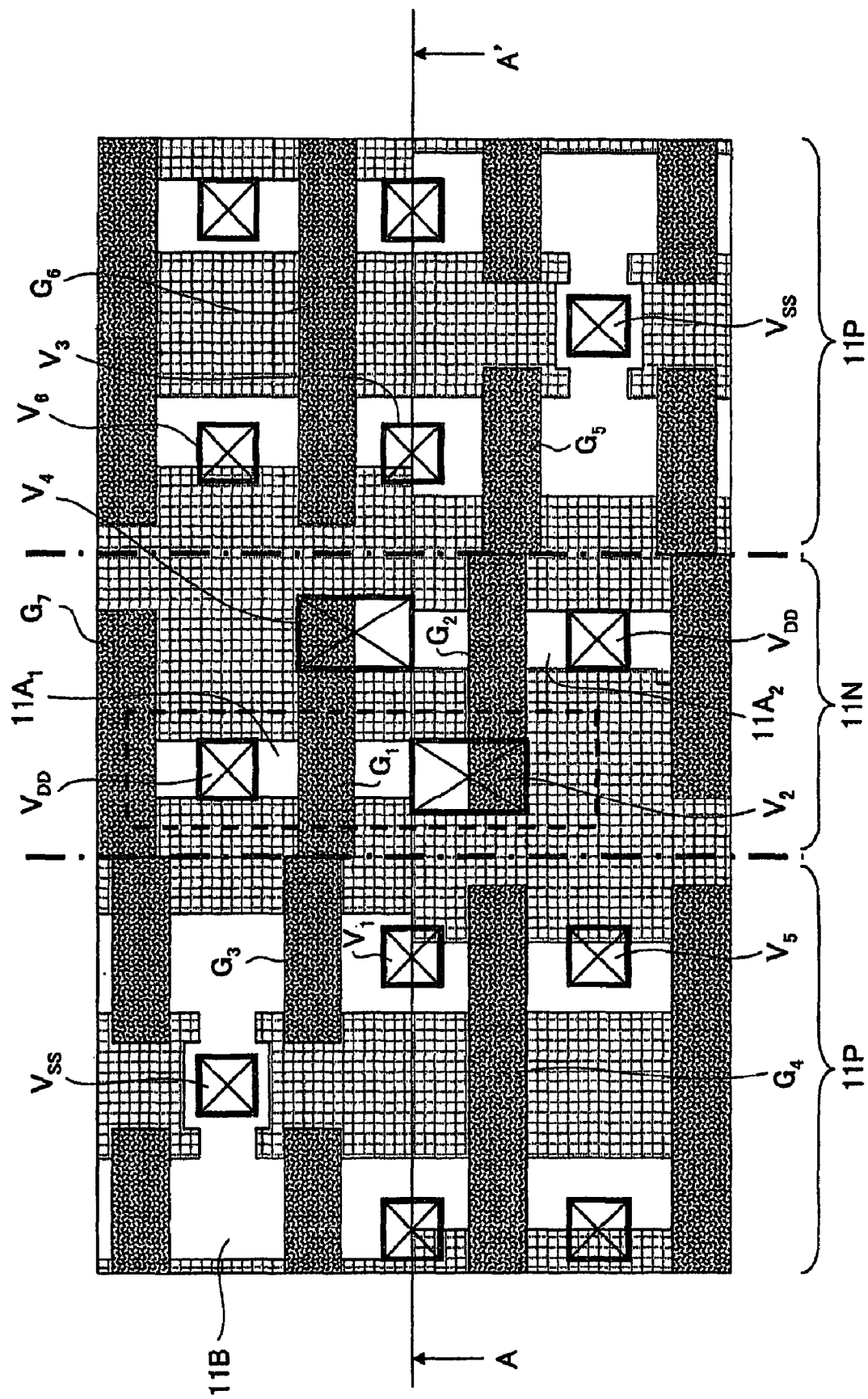
FIGS. 2A and 2B are diagrams explaining the construction of an SRAM according to a related art.

FIG. 2A shows an SRAM layout corresponding to the equivalent circuit diagram of FIG. 1 according to a related art of the present invention. Further, FIG. 2B shows a cross-sectional diagram taken along a line A-A' of FIG. 2A.

Figure 2B:
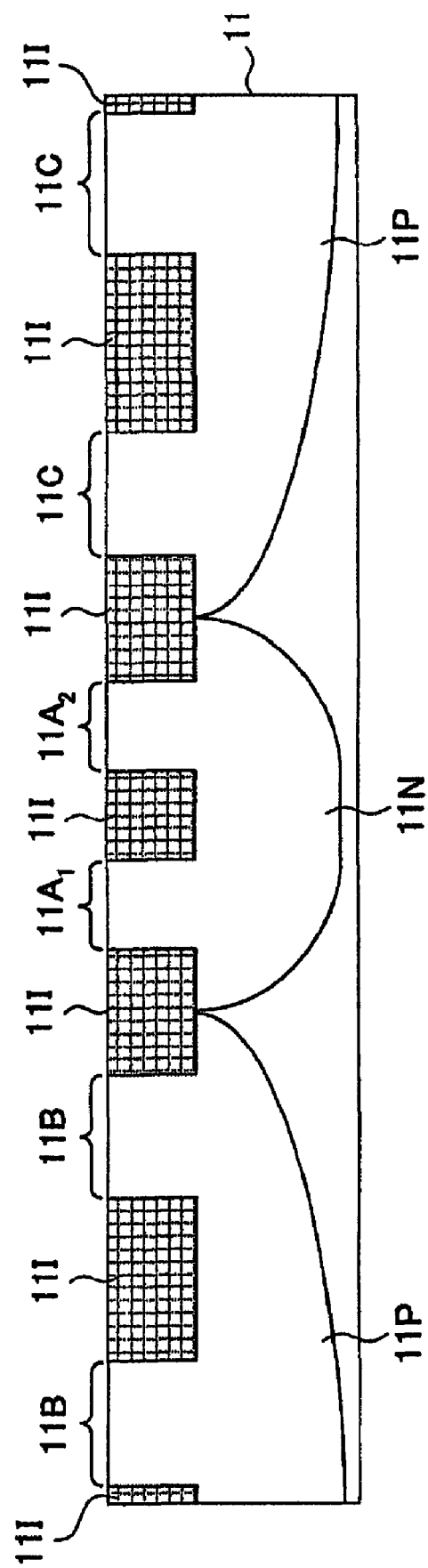

Referring to FIGS. 2A and 2B, there are formed an n-type well 11N and a p-type well 11P on the surface of the silicon substrate 11 by an ion implantation process, wherein it can be seen that there are formed n-type device regions $11A_1$ and $11A_2$ in the n-type well 11N by a device isolation region 11I in a symmetric relationship. Further, in the p-type well 11P, there are formed p-type device regions 11B and 11C by the device isolation region 11I.

In the device regions $11A_1$ and $11A_2$, there are formed load transistors $LT_1$ and $LT_2$ of FIG. 1 in the form of a p-channel MOS transistor respectively, wherein the load transistor $LT_1$ has a p-type polysilicon gate electrode $G_1$ crossing the device region $11A_1$. Likewise, the load transistor $LT_2$ has a p-type polysilicon gate electrode $G_2$ crossing the device region $11A_2$.

In a part of the n-type device region $11A_1$ located at one side of the gate electrode $G_1$, there is formed a power contact $V_{DD}$. Further, there is formed a via-plug $V_2$ in the n-type device region $11A_1$ at the other side of the gate electrode $G_1$ for connecting the polysilicon gate $G_2$ to the device region $11A_1$.

Similarly, in a part of the n-type device region $11A_2$ located at a one side of the gate electrode $G_2$, there is formed a power contact $V_{DD}$, while it can be seen that there is formed a via-plug $V_4$ in the n-type device region $11A_2$ at the other side of the gate electrode $G_2$ for connecting the polysilicon gate $G_1$ to the device region $11A_2$.

Further, in the p-type well 11P located at the left side of the n-type well 11N, it can be seen that the device isolation region 11I defines the p-type device region 11B and that there is formed an n-channel MOS transistor having an n-type polysilicon gate electrode $G_3$ in a region of increased width of the p-type device region 11B as the driver transistor $DT_1$. Further, there is formed an n-channel MOS transistor having an n-type polysilicon gate electrode $G_4$ in a part of the p-type device region 11B of narrow width as the transfer transistor $TF_1$.

Similarly, in the p-type well 11P located at the right side of the n-type well 11N, it can be seen that the device isolation region 11I defines the p-type device region 11C and that there is formed an n-channel MOS transistor having an n-type polysilicon gate electrode $G_5$ in a region of increased width of the p-type device region 11C as the driver transistor $DT_2$. Further, there is formed an n-channel MOS transistor having an n-type polysilicon gate electrode $G_6$ in a part of the p-type device region 11C of narrow width as the transfer transistor $TF_2$.

Further, there is formed a via-contact $V_1$ in a part of the device region 11B between the gate electrodes $G_3$ and $G_4$, wherein the via-contact $V_1$ is connected to the via-contact $V_2$ by way of a local interconnection pattern (not illustrated). Similarly, there is formed a via-contact $V_3$ in a part of the device region 11C between the gate electrodes $G_5$ and $G_6$, wherein the via-contact $V_3$ is connected to the via-contact $V_4$ by way of a local interconnection pattern (not illustrated). Here, the via-contacts $V_1$ and $V_2$ constitute the node $N_1$ of FIG. 1, while the via-contacts $V_3$ and $V_4$ constitute the node $N_2$.

Further, there is formed a ground contact in a part of the p-type device region 11B at an opposite side of the via-contact $V_1$ with regard to the gate electrode $G_2$, and there is formed a via-contact $V_5$ connected to the bit line BL in a part of the p-type device region 11B at the opposite side of the via-contact $V_1$ with regard to the gate electrode $G_4$. Similarly, there is formed a ground contact $V_{SS}$ in a part of the p-type device region 11C at an opposite side of the via-contact $V_3$ with regard to the gate electrode $G_5$, and there is formed a via-contact $V_6$ connected to the bit line /BL in a part of the p-type device region 11C at the opposite side of the via-contact $V_3$ with regard to the gate electrode $G_6$.

Further, with the layout of FIG. 2, there is formed a gate electrode $G_7$ of a different memory cell across the n-type device region $11A_1$.

Meanwhile, the inventor of the present invention has obtained interesting results shown in FIG. 3 as a result of analysis of the characteristics of the load transistor in a single bit defective part of the SRAM of such a construction.

Referring to FIG. 3, the horizontal axis represents the gate voltage and the vertical axis represents the drain current, wherein it can be seen that a large drain current is attained with the experiment indicated by the numeral 2, while there is caused a decrease of drain current with the experiment indicated by the numeral 1 for the same gate voltage.

Figure 4A:
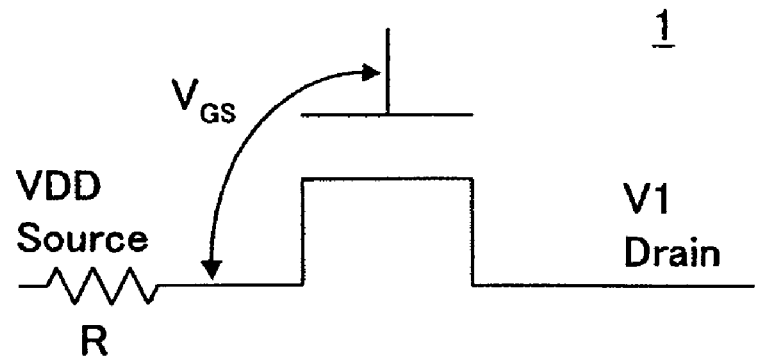
FIGS. 4A and 4B are further diagrams explaining the problems to be solved.

Here, the experiment designated with the numeral 1 represents the case shown in FIG. 4A in which a supply voltage $V_{DD}$ is applied to the source side of the p-channel MOS transistor constituting the load transistor while grounding the drain side. On the other hand, the experiment designated with the numeral 2 represents the case shown in FIG. 4B in which a supply voltage $V_{DD}$ is applied to the drain side of the same p-channel MOS transistor while grounding the source side.

Figure 4B:
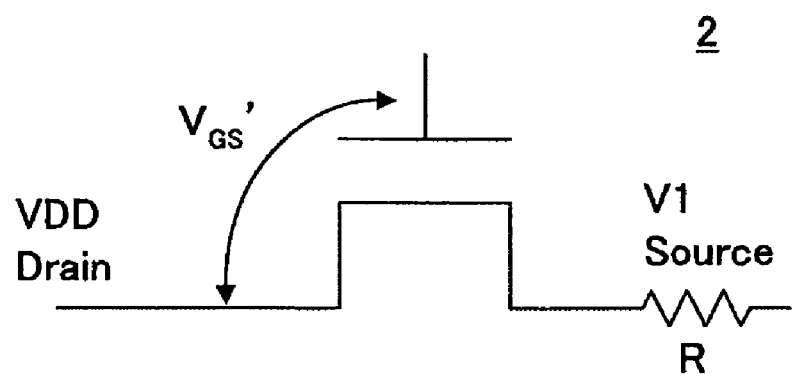

The fact that a small drain current is obtained in the experiment of FIG. 3 designated by the numeral 1 and that a large drain current is obtained in the experiment designated by the numeral 2 indicates that there exists a resistance R at the source side of the load transistor as shown in FIGS. 4A and 4B. In the case of FIG. 4A, the existence of the resistance R at the source side, to which the supply voltage $V_{DD}$ is applied, induces a decrease of the voltage $V_{GS}$ applied effectively across the source and drain, while this tends to lead to incomplete conduction of the transistor. In the case of FIG. 4B, on the other hand, there exists no such a resistance at the source side and there is caused no voltage drop in the source-gate voltage as a result of the resistance R.

In the equivalent circuit diagram, such a resistance R is thought to be formed in the part circled in the drawing by a broken line.

Figure 5C:
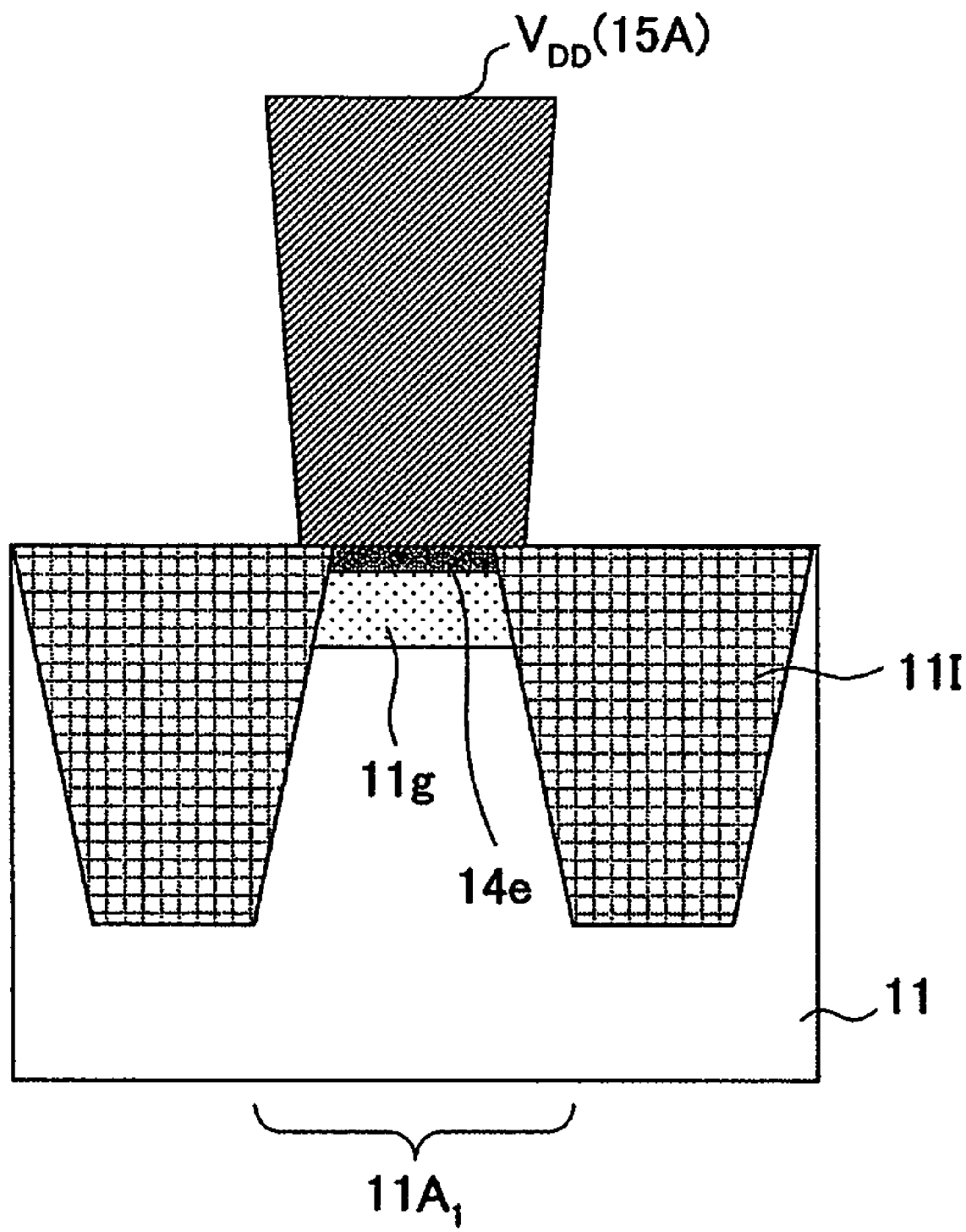

FIG. 5A shows a plan view of the SRAM of FIG. 2 for the part surrounded in FIG. 2 by a broken line, while FIG. 5B shows a cross-sectional diagram taken along a line A-A' of FIG. 5A. Further, FIG. 5C shows a cross-sectional diagram taken along a line B-B' of FIG. 5A. Further, FIG. 6 is a diagram showing the part surrounded by the broken line in FIG. 5B with enlarged scale.

Referring to FIG. 5A, it can be seen that the n-type diffusion region $11A_1$ is defined on the silicon substrate 11 by the device isolation region 11I, and the gate electrodes $G_1$ and $G_7$ extend across the n-type device region $11A_1$. Further, a power contact $V_{DD}$ is formed between the gate electrodes $G_1$ and $G_7$. Further, the via-contact $V_2$ is formed in a manner to connect the gate electrode $G_2$ and the n-channel region $11A_1$.

As shown in the cross-sectional diagram of FIG. 5B, the gate electrodes $G_1$, $G_2$ and $G_7$ are formed respectively in the form of polysilicon patterns 13A, 13B and 13C each doped to n-type, wherein each of the gate electrodes $G_1$, $G_2$ and $G_7$ carries, on respective sidewall surfaces, sidewall insulation films SW of typically a silicon oxide film.

In the cross-sectional diagram of FIG. 5B, the polysilicon patterns 13A and 13C are formed on the n-type device region $11A_1$ via gate insulation films 12A and 12C, while the polysilicon pattern 13B is formed on the device isolation insulation film 11I.

In the device region $11A_1$, there is formed a p-type source extension diffusion region 11a at one side of the gate electrode pattern 13A and a p-type drain extension diffusion region 11b is formed in the device region $11A_1$ at an opposite side of the gate electrode pattern 13A. Similarly, there is formed a p-type source extension diffusion region 11c at one side of the gate electrode pattern 13C and a p-type drain extension diffusion region 11d is formed in the device region $11A_1$ at an opposite side of the gate electrode pattern 13C.

Further, in the n-type device region $11A_1$, there is formed a $p^+$-type diffusion region 11e in a part between the gate electrode patterns 13A and 13C so as to be located at the respective outer sides of the sidewall insulation films SW as the source regions of the respective load transistors having the gate electrodes $G_1$ and $G_7$.

Further, in the n-type device region $11A_1$, there is formed a drain region 11f of similar $p^+$-type diffusion region at the opposite side of the source region 11e with regard to the gate electrode pattern 13A so as to be located between the sidewall insulation film SW and the device isolation insulation film 11I.

Further, there are formed silicide layers 14A-14C on the respective surfaces of the polysilicon gate electrode patterns 13A-13C, and silicide layers 14e and 14f are formed on the respective surfaces of the source region 11e and the drain region 11f.

Further, the polysilicon gate electrode patterns 13A-13C, including the silicide layers 14A-14C and the sidewall insulation films SW, are covered with an interlayer insulation film 15 formed on the silicon substrate 11, and a via-plug 15A constituting the via-contact $V_{DD}$ is contacted to the source region 11e via the silicide layer 14e. Further, a via-plug 15B constituting the via-contact $V_2$ makes a contact with the drain region 11f via the silicide layer 14f. Thereby, it should be noted that the sidewall insulation film SW of the polysilicon gate electrode 13B at the side of the polysilicon gate electrode pattern 13A is removed, and with this, the via-plug 15B performs the function of connecting the polysilicon gate electrode pattern 14B to the drain region 11f electrically.

Further, with reference to FIG. 5C, it will be noted that, because of the extreme miniaturization of the SRAM of the present invention, the via-plug 15A has a diameter larger than the width of the device region $11A_1$ when viewed in the cross-sectional view taken along the line B-B' of FIG. 5A.

Now, in the case the via-plugs 15A and 15B are formed at the respective, predetermined or nominal positions, the via-plugs 15A and 15B cause electrical contact with the source regions 11e and 11f via the silicide layers 14e and 14f, respectively. As a result, the source current is injected efficiently from the via-plug 15A into the source region 11e via the silicide layer 11e. In the case there is caused a positional offset in the via-plugs 15A and 15B as shown in FIG. 15B by the continuous lines, on the other hand, there is a concern that the via-plug 15A may contact directly with the p-type diffusion region 11a as represented in FIG. 5B by a small circle.

FIG. 6 shows the part of FIG. 5B in the vicinity of the via-plug 15A with enlarged scale.

Referring to FIG. 6, it can be seen that the via-plug 15A has the tip end thereof invading into the p-type diffusion region 11a, and as a result, there is caused a restriction of carrier path from the $p^+$-type source region 11e to the p-type source extension region 11a and further to the channel region right underneath the polysilicon gate electrode pattern 13A. The via-plug 15A is generally formed of a metal such as W (tungsten), wherein the surface thereof is covered by a metal such as Ta or Ti or a conductive nitride such as TiN. Thus, the depletion layer extending from the surface of the via-plug 15A into the interior of the $p^-$-type source region 11a restricts the carrier path further. It is believed that this is the cause of the source resistance explained with reference to FIG. 3 and FIGS. 4A and 4B.

When such a source resistance appears in one of the load transistors constituting an SRAM at the location shown by the broken line in FIG. 1, for example, there is caused instability in the operation of the SRAM, while this leads to formation of defective memory cell.

Such a problem of misalignment of via-plug may be avoided by using the technology of so-called self-aligned contact that forms the sidewall insulation films SW with a material having resistance against the etching used for formation of the via-hole corresponding to the via-plug 15A. In the case of the SRAM having the layout of FIG. 2, however, there is a need of removing one of the sidewall insulation films of the polysilicon gate electrode G2 as shown in FIG. 5B, and thus, it is difficult to construct the sidewall insulation films with a material having etching resistance.

In a first aspect, the present invention provides a semiconductor memory device comprising: a semiconductor substrate; a first CMOS inverter comprising first and second MOS transistors having respective, mutually different channel conductivity types and connected in series at a first node on said semiconductor substrate; a second CMOS inverter comprising third and fourth MOS transistors having respective, mutually different channel conductivity types and connected in series at a second node on said semiconductor substrate, said second CMOS inverter forming, together with said first CMOS inverter, a flip-flop circuit; a first transfer transistor provided on said semiconductor substrate between a first bit line and said first node, said first transfer transistor having a first gate electrode connected to a word line and driven by a selection signal on said word line; a second transfer transistor provided on said semiconductor substrate between a second bit line and said second node, said second transfer transistor having a second gate electrode connected to said word line and driven by a selection signal on said word line; a polysilicon resistance element formed on a device isolation region on said semiconductor substrate, each of said first and third MOS transistors being formed in a device region of a first conductivity type defined in said semiconductor substrate by said device isolation region, each of said first and third MOS transistors comprising: a polysilicon gate electrode formed on said semiconductor substrate via a gate insulation film and carrying gate sidewall insulation films at respective sidewall surfaces thereof; a second conductivity type source region formed in said semiconductor substrate at a first side of said polysilicon gate electrode such that an end part of said second conductivity type source region invades into a part of said semiconductor substrate right underneath said polysilicon gate electrode; a second conductivity type drain extension region formed in a surface part of said semiconductor substrate at a second side opposite to said first side of said polysilicon gate electrode such that an end part of said second conductivity type drain extension region invades into a part of said semiconductor substrate right underneath said polysilicon gate electrode; and a second conductivity type drain region formed in said semiconductor substrate at an outer side of said gate sidewall insulation film of said second side in overlapping with said drain extension region with a depth larger than a depth of said second conductivity type drain extension region, wherein said source region is formed deeper than said drain extension region, said polysilicon gate electrode having a film thickness identical to a film thickness of said polysilicon resistance element, said source region and said polysilicon resistance element being doped with the same dopant element.

In another aspect, the present invention provides a method for fabricating a semiconductor memory device, said semiconductor memory device comprising: a first CMOS inverter comprising first and second MOS transistors having respective, mutually opposite channel conductivity types and connected in series at a first node on a semiconductor substrate; a second CMOS inverter comprising third and fourth MOS transistors having respective, mutually opposite channel conductivity types and connected in series at a second node on said semiconductor substrate, said second CMOS inverter forming, together with said first CMOS inverter, a flip-flop circuit; a first transfer transistor provided on said substrate between a first bit line and said first node, said first transfer transistor having a first gate electrode connected to a word line and driven by a selection signal on said word line; a second transfer transistor provided on said substrate between a second bit line and said second node, said second transfer transistor having a second gate electrode connected to said word line and driven by a selection signal on said word line; and a polysilicon resistance element formed on a device isolation region on said semiconductor substrate, said method comprising the steps of: forming a first polysilicon pattern constituting a gate electrode of said first MOS transistor on a device region of a first conductivity type defined on said semiconductor substrate by said device isolation region via a gate insulation film, simultaneously with a second polysilicon pattern constituting said polysilicon resistance element on said device isolation region, as a result of patterning of a polysilicon film; introducing an impurity element of said second conductivity type into said device region at a first side of said first polysilicon pattern and further into said second polysilicon pattern such that there is formed a source region of said second conductivity type at said first side of said first polysilicon pattern in said device region and doping said second polysilicon pattern with said impurity element; introducing an impurity element of said second conductivity type into said device region at said first side and at a second side opposite to said first side of said first polysilicon pattern and further into said second polysilicon pattern such that there is formed a drain extension region in a surface part of said device region at said second side of said first polysilicon pattern with an impurity concentration lower than an impurity concentration of said source region and increasing an impurity concentration of said second polysilicon pattern; forming sidewall insulation films on respective sidewall surfaces of said first and second polysilicon patterns; and introducing an impurity element of said second conductivity type into said device region and further into said second polysilicon pattern while using said first polysilicon pattern and said sidewall insulation films at said first side and said second side of said first polysilicon pattern as a mask such that there are formed drain regions of said second conductivity type at respective outer parts of said sidewall insulation films of said first side and said second side of said first polysilicon pattern and such that an impurity concentration of said second polysilicon pattern is increased.

In a further aspect, the present invention provides a semiconductor memory device comprising: a semiconductor substrate; a first CMOS inverter comprising first and second MOS transistors having respective, mutually opposite channel conductivity types and connected in series at a first node on said semiconductor substrate; a second CMOS inverter comprising third and fourth MOS transistors having respective, mutually opposite channel conductivity types and connected in series at a second node on said semiconductor substrate, said second CMOS inverter forming, together with said first CMOS inverter, a flip-clop circuit; a first transfer transistor provided on said semiconductor substrate between a first bit line and said first node, said first transfer transistor having a first gate electrode connected to a word line and driven by a selection signal on said word line; a second transfer transistor provided on said semiconductor substrate between a second bit line and said second node, said second transfer transistor having a second gate electrode connected to said word line and driven by a selection signal on said word line, said first MOS transistor being formed in a first device region of a band shape formed on said semiconductor substrate by a device isolation region, said first MOS transistor having a gate electrode of a first polysilicon pattern traversing said first device region, said third MOS transistor being formed in a second device region of a band shape formed on said semiconductor substrate by said device isolation region, said third MOS transistor having a gate electrode of a second polysilicon pattern traversing said second device region, said first polysilicon pattern being connected to a first end part of said second device region by a first via-plug, said second polysilicon pattern being connected to a first end of said first device region by a second via-plug, a third via-plug being in contact with a part of said first device region at a side opposite to a side of said first via-plug with regard to said first polysilicon pattern as a power contact, a fourth via-plug being in contact to a part of said second device region at a side opposite to said second via-plug with regard to said second polysilicon pattern as a power contact, said third via-plug having a diameter larger than a width of said first device region, said fourth via-plug having a diameter larger than a width of said second device region, said third via-plug being offset from a central line of said first device region, said fourth via-plug being offset from a central line of said second device region.

According to the present invention, the problem of increase of source resistance is avoided even in the case there is caused positional offset of power contact in the load transistor that constitutes the SRAM, and it becomes possible to avoid occurrence of defects.

[First Embodiment]

FIG. 7A shows the layout of an SRAM 20 according to a first embodiment. Further, FIG. 7B shows a cross-sectional diagram taken along a line A-A' of FIG. 7A.

Referring to FIGS. 7A and 7B, the SRAM 20 is formed on a silicon substrate 21 and has a construction to form an equivalent circuit diagram identical to that shown in FIG. 1.

More specifically, there are formed an n-type well 21N and a p-type well 21P on the surface of the silicon substrate 21 by an ion implantation process, wherein there are formed n-type device regions $21A_1$ and $21A_2$ in the n-type well 21N by a device isolation region 21I in point symmetry. Further, in the p-type well 21P, there are formed p-type device regions 21B and 21C by the device isolation region 21I.

In the device regions $21A_1$ and $21A_2$, there are formed load transistors $LT_1$ and $LT_2$ of FIG. 1 in the form of a p-channel MOS transistor, respectively, wherein the load transistor $LT_1$ has a p-type polysilicon gate electrode G1 crossing the device region $21A_1$, while the load transistor $LT_2$ has a p-type polysilicon gate electrode $G_2$ traversing the device region $21A_2$.

In a part of the n-type device region $11A_1$ located at one side of the gate electrode $G_1$, there is formed a power contact $V_{DD}$, while it can be seen that there is formed a via-plug $V_2$ in the n-type device region $21A_1$ at the other side of the gate electrode $G_1$ for connecting the polysilicon gate $G_2$ to the device region $21A_1$.

Similarly, in a part of the n-type device region $21A_2$ located at a one side of the gate electrode $G_2$, there is formed a power contact $V_{DD}$, while it can be seen that there is formed a via-plug $V_4$ in the n-type device region $11A_2$ at the other side of the gate electrode $G_2$ for connecting the polysilicon gate $G_1$ to the device region $21A_2$.

Further, in the p-type well 21P located at the left side of the n-type well 21N, it can be seen that the device isolation region 21I defines the p-type device region 21B and that there is formed an n-channel MOS transistor having an n-type polysilicon gate electrode $G_3$ in a region of increased width of the p-type device region 11B as the driver transistor $DT_1$. Further, there is formed an n-channel MOS transistor having an n-type polysilicon gate electrode $G_4$ in a part of the p-type device region 21B of narrow width as the transfer transistor $TF_1$.

Similarly, in the p-type well 21P located at the right side of the n-type well 21N, it can be seen that the device isolation region 21I defines the p-type device region 21C and that there is formed an n-channel MOS transistor having an n-type polysilicon gate electrode $G_5$ in a region of increased width of the p-type device region 21C as the driver transistor $DT_2$. Further, there is formed an n-channel MOS transistor having an n-type polysilicon gate electrode $G_6$ in a part of the p-type device region 21C of narrow width as the transfer transistor $TF_2$.

Further, there is formed a via-contact $V_1$ in a part of the device region 21B between the gate electrodes $G_3$ and $G_4$, wherein the via-contact $V_1$ is connected to the via-contact $V_2$ by way of a local interconnection pattern (not illustrated).

Similarly, there is formed a via-contact $V_3$ in a part of the device region 21C between the gate electrodes $G_5$ and $G_6$, wherein the via-contact $V_3$ is connected to the via-contact $V_4$ by way of a local interconnection pattern (not illustrated). Here, the via-contacts $V_1$ and $V_2$ constitute the node $N_1$ of FIG. 1, while the via-contacts $V_3$ and $V_4$ constitute the node $N_2$.

Further, there is formed a ground contact in a part of the p-type device region 21B at an opposite side of the via-contact $V_2$ with regard to the gate electrode $G_2$, and there is formed a via-contact $v_5$ connected to the bit line BL in a part of the p-type device region 11B at the opposite side of the via-contact $V_1$ with regard to the gate electrode $G_4$. Similarly, there is formed a ground contact $V_{SS}$ in a part of the p-type device region 21C at an opposite side of the via-contact $V_3$ with regard to the gate electrode $G_5$, and there is formed a via-contact $v_6$ connected to the bit line /BL in a part of the p-type device region 21C at the opposite side of the via-contact $V_3$ with regard to the gate electrode $G_6$.

Further, with the layout of FIG. 7A, there is formed a gate electrode G7 of another memory cell across the n-type device region $21A_1$, and there is further formed a resistance element R of polysilicon pattern on the device isolation structure 21I in a different part of the same silicon substrate 21. It can be seen that the resistance element R is formed with via-contacts $V_{R1}$ and $V_{R2}$.

FIG. 8 shows a cross-sectional diagram taken along the line B-B'.

Referring to FIG. 8, the gate electrodes $G_1$, $G_2$ and $G_7$ are formed respectively in the form of polysilicon patterns 23A, 23B and 23C each doped to n-type, wherein each of the gate electrodes $G_1$, $G_2$ and $G_7$ carries, on respective sidewall surfaces, sidewall insulation films SW of typically a silicon oxide film.

In the cross-sectional diagram of FIG. 8, the polysilicon patterns 23A and 23C are formed on the n-type device region $21A_1$ via gate insulation films 22A and 22C, while the polysilicon pattern 23B is formed on the device isolation insulation film 21I.

With the SRAM 20 of the present embodiment, a $p^+$-type diffusion region $21a$ is formed in the device region $21A_1$ at one side of the gate electrode pattern 23A as the source region, and there is formed a p-type diffusion region $21b$ at the other side as the drain extension region. Similarly, there is formed a p-type diffusion region $21c$ in the device region $21A_1$ at one side of the gate electrode pattern 23C as the drain extension region, the $p^+$-type diffusion region $21a$ is formed as a common source region at the other side.

Further, in the n-type device region $21A_1$, there is formed a drain region $21d$ of a $p^+$-type diffusion region at the opposite side of the source region $21a$ with regard to the gate electrode pattern 23A at a location between the sidewall insulation film SW and the device isolation insulation film 21I.

Further, there are formed silicide layers 24A-24C on the respective surfaces of the polysilicon gate electrode patterns 23A-23C, and silicide layers $24a$ and $24d$ are formed on the respective surfaces of the source region $21a$ and the drain region $21d$.

On the silicon substrate 21, there is formed an interlayer insulation film 25 so as to cover the polysilicon gate electrode patterns 23A-23C including the silicide layers 24A-24C and the sidewall insulation films SW, wherein the interlayer insulation film 25 is formed with a via-plug 25A constituting the via-contact $V_{DD}$ in correspondence to the source region $21a$ such that the via-plug 25A makes a contact thereto via the silicide layer $24a$. Similarly, the interlayer insulation film 25 is formed with a via-plug 25B constituting the via-contact $V_2$ in correspondence to the drain region $21d$ such that the via-plug 25B makes a contact thereto via the silicide layer $24d$. Thereby, it should be noted that the sidewall insulation film SW of the polysilicon gate electrode 23B at the side of the polysilicon gate electrode pattern 23A is removed, and with this, the via-plug 25B performs the function of connecting the polysilicon gate electrode pattern 23B to the drain region $21d$ electrically.

Further, with the SRAM 20 of FIG. 8, there is formed a polysilicon pattern 23D on another part of the same device isolation region 21I on the same silicon substrate 21 as a polysilicon resistance element R, and the interlayer insulation film 25 is formed with via-plugs 25E and 25F so as to make a contact with the polysilicon pattern 23D via respective silicide layers $24e$ and $24f$. It should be noted that the polysilicon pattern 23D is formed simultaneously to the polysilicon gate patterns 23A-23C and is formed with the sidewall insulation films SW similarly. Further, with the illustrated example, it can be seen that there is left a dielectric pattern $25d$, which is used for the mask at the time of formation of the silicide layers $24e$ and $24f$, on the polysilicon pattern 23D.

With the present embodiment, the polysilicon pattern 23D constituting the resistance element R is formed simultaneously to the polysilicon gate electrode patterns 23A-23C as a result of patterning of the same polysilicon film, and thus, the polysilicon pattern 23D has the same film thickness, and hence the same height, to each of the polysilicon gate electrode patterns 23A-23D. Further, the polysilicon pattern 23D is doped by the same impurity element to the same concentration level as in the case the polysilicon gate electrode patterns 23A-23D.

Next, the fabrication process of the SRAM 20 of FIG. 8 will be explained with reference to FIGS. 9A-9H.

Referring to FIG. 9A, the polysilicon patterns 23A-23D are formed on the silicon substrate 21 as a result of patterning of a polysilicon film (not shown), such that the polysilicon patterns 23A and 23C are formed on the device region $21A_1$ respectively via gate insulation films 22A and 22C, and such that the polysilicon pattern 23B and 23D are formed on the device isolation insulation film 21I that defines the device region $21A_1$. In the description hereinafter, the polysilicon pattern 23D used to form the resistance element R is carried upon the device isolation insulation film 21I that also carries thereon the polysilicon pattern 23B.

Next, in the step of FIG. 9B, the device region $21A_1$ is covered with a resist pattern R except for the part located between the polysilicon pattern 23A and the polysilicon pattern 23B, and B+ ions are injected into the part of the device region $21A_1$ not covered with the resist pattern R by an ion implantation process conducted under an acceleration voltage of 8 keV with a dose of $4.0 \times 10^{15}$ $cm^2$. As a result, the $p^+$-type diffusion region $21a$ is formed in the device region $21A_1$ between the polysilicon patterns 23A and 23C. At the same time, with the step of FIG. 9B, the polysilicon patterns 21A-21C and the polysilicon pattern 23D on the device isolation insulation film 21I are doped with B to $p^+$-type.

Next, in the step of FIG. 9C, the resist pattern R is removed, and ion implantation of B+ is conducted into the device region $21A_1$ while using the polysilicon patterns 23A and 23C as a mask. With this, there are formed p-type drain extension regions $21b$ and $21c$ on the device region $21A_1$ at respective sides of the polysilicon patterns 23A and 23C away from the source region $21a$. At the same time, a similar injected region $21b'$ is formed in a surface part of the source region $21a$ in overlapping therewith.

Further, in the ion implantation process of FIG. 9C, the same ion implantation of B is conducted to the polysilicon patterns 23A-23C under the same condition.

Figure 9D:
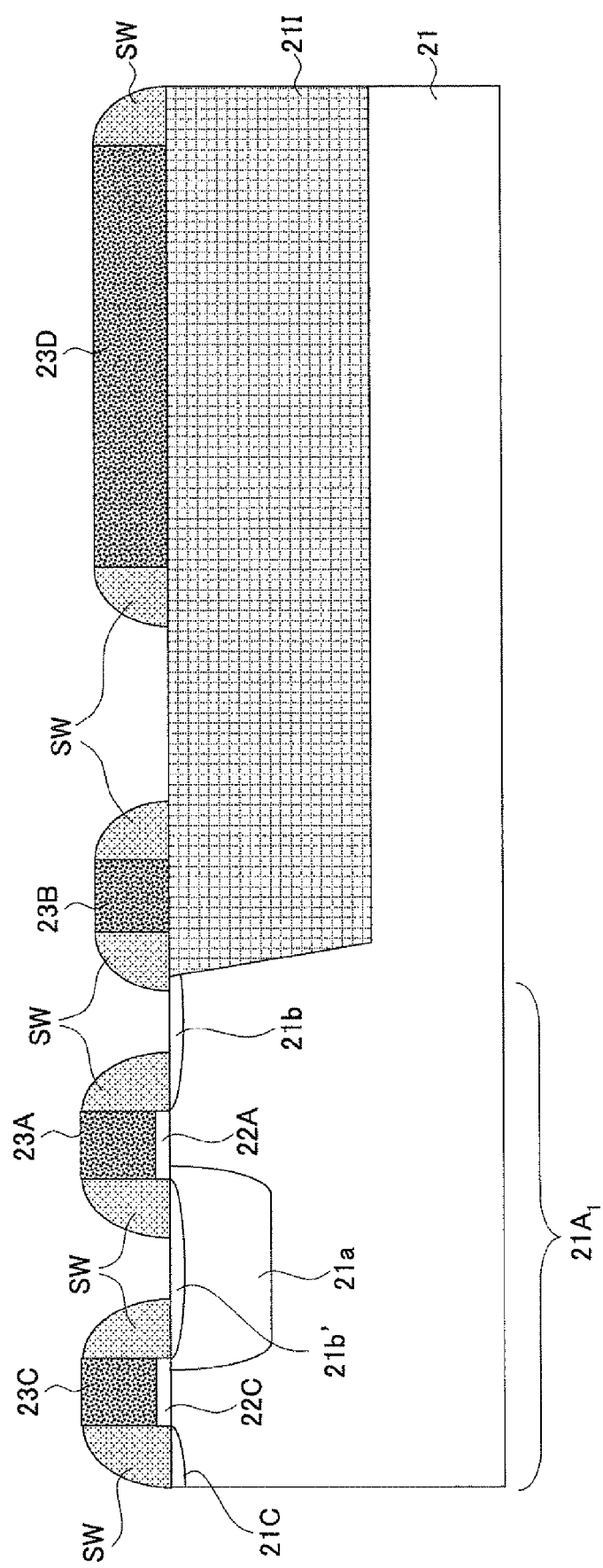

Next, in the step of FIG. 9D, an insulation film (not shown) is deposited on the structure of FIG. 9C by a CVD process, followed by an etchback process conducted by an anisotropic etching process that works generally perpendicularly to the substrate surface. With this, sidewall insulation films SW are formed on the respective sidewall surfaces of the polysilicon patterns 23A-23D. Further, in the next step of FIG. 9E, the device region $21A_1$ is introduced with B+ by an ion implantation process while using the polysilicon patterns 21A and 21C as a mask. With this, the $p^+$-type drain region $21d$ is formed between the polysilicon pattern 23A and the device isolation insulation film 21I carrying the polysilicon pattern 23B at the part outside of the sidewall insulation film SW. Further, similar ion implantation of B is conducted also into the interior of the $p^+$-type source region $21a$, and there is formed a $p^+$-type ion implantation region $21d'$ in overlapping with the $p^+$-type source region $21a$.

Further, in the step of FIG. 9E, the ion implantation of B is conducted to the polysilicon patterns 23A-23D under the same condition.

Figure 9F:
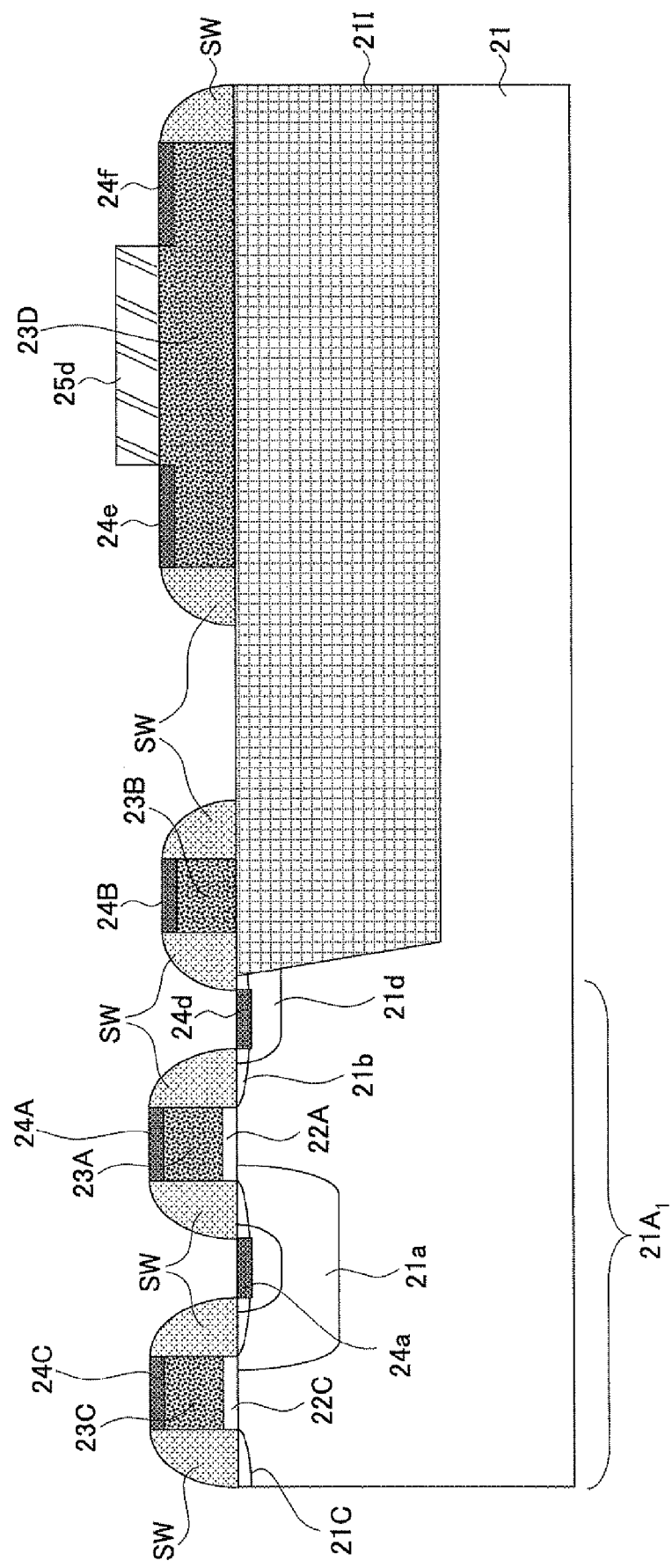

Next, in the step of FIG. 9F, a silicide layer is formed on the exposed silicon surface of the structure of FIG. 9E by a salicide process, and as a result, there are formed silicide layers 24A-24C on the polysilicon patterns 23A-23C respectively. Further, silicide layers $21a$ and $24d$ are formed on the source region $21a$ and the drain region $21d$. Further, in the polysilicon pattern 23D constituting the resistance element R, there are formed two silicide formation regions in separation from each other by a dielectric pattern $25d$, and the silicide layers $24e$ and $24f$ are formed on such silicide formation regions.

Further, with the step of FIG. 9G, there are formed via-holes in the interlayer insulation film 25 so as to expose the silicide layers $24a$ and $24d$, and the SRAM 20 of the equivalent circuit explained with reference to FIG. 1 is obtained by filling the via-holes with the via-plugs 25A and 25B.

Figure 9G:
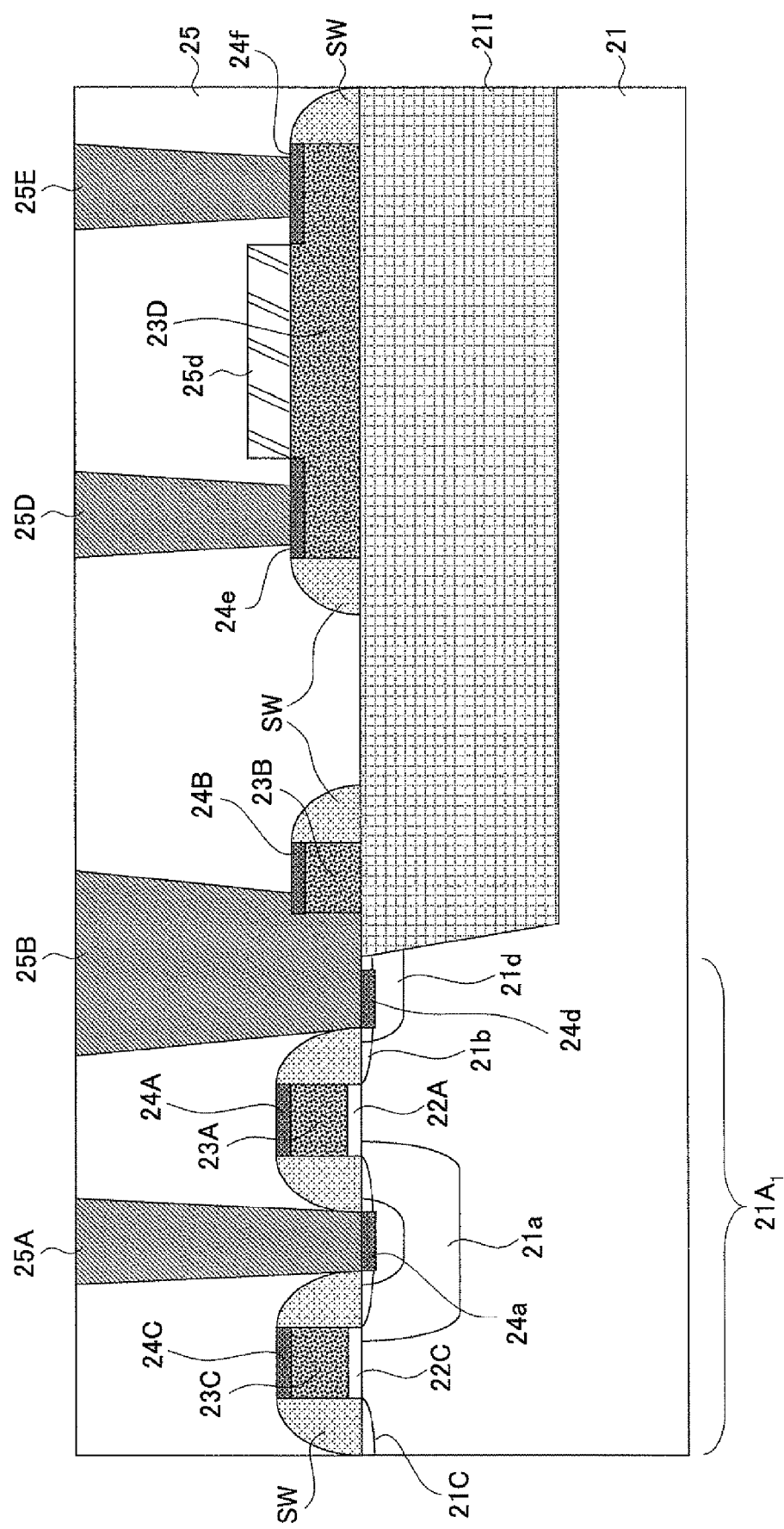

Further, with the step of FIG. 9G, there are formed via-holes exposing the silicide layers $24e$ and $24f$ of the polysilicon pattern 23D in the interlayer insulation film 25, and the resistance element R of the polysilicon pattern 23D is formed simultaneously by filling the via-holes with the via-plugs 25D and 25E.

Figure 9H:
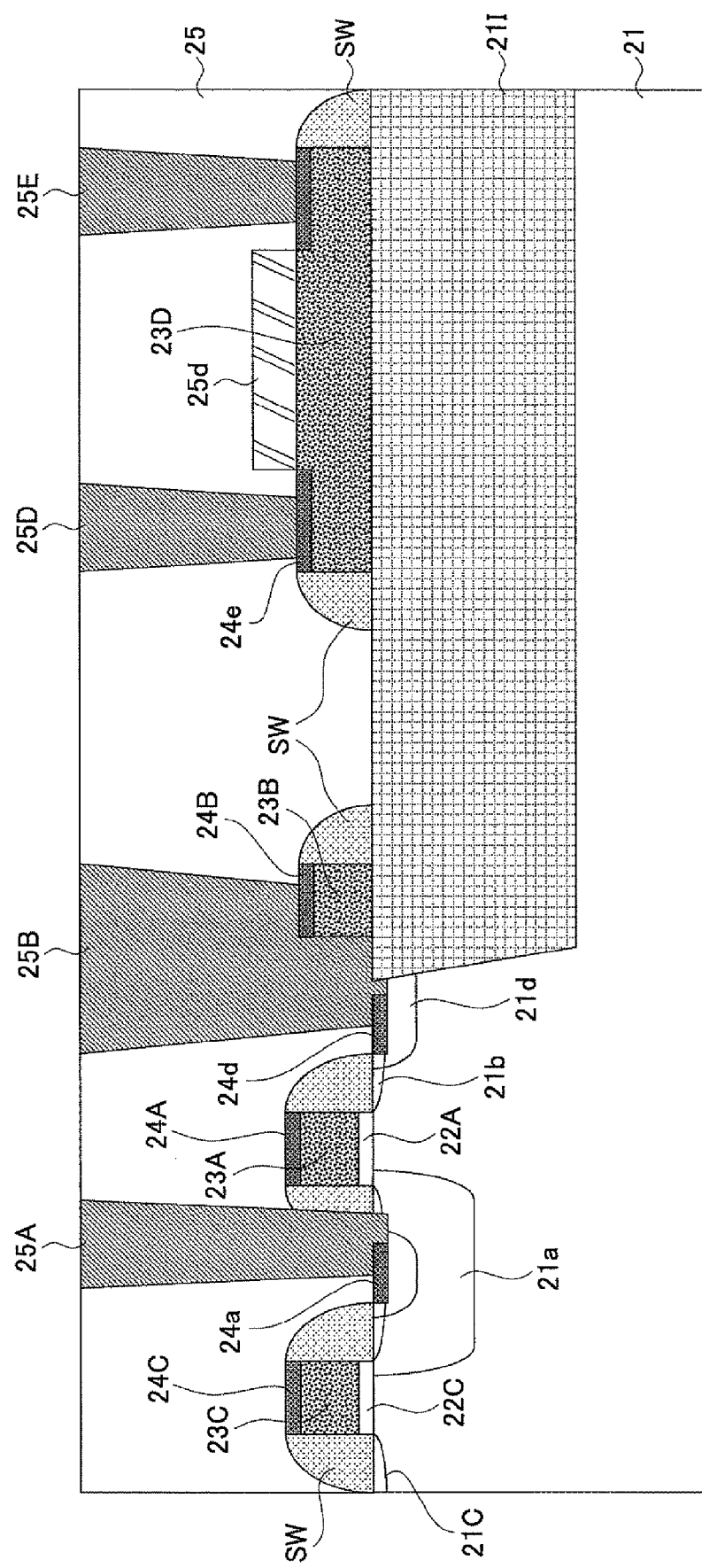

While FIG. 9G shows the state in which there is no positional offset in the via-plugs 25A and 25B, while even in the case the via-plugs 25A and 25B are displaced in the direction to the polysilicon patterns 23A and 23B as shown in FIG. 9H, the via-plug 25A maintains the contact to the high-concentration diffusion region $21a$, and there arises no increase of source resistance in the load transistor that uses the polysilicon pattern 23A as the gate electrode. Thus, there arises no problem of change of transistor characteristics explained previously with reference to FIG. 3.

Further, with the present embodiment, in which the formation of the high-concentration diffusion region $21a$ is conducted simultaneously to the formation of the polysilicon resistance element, there arises no problem of increased fabrication process steps or increase of fabrication cost.

[Second Embodiment]

Figure 10:
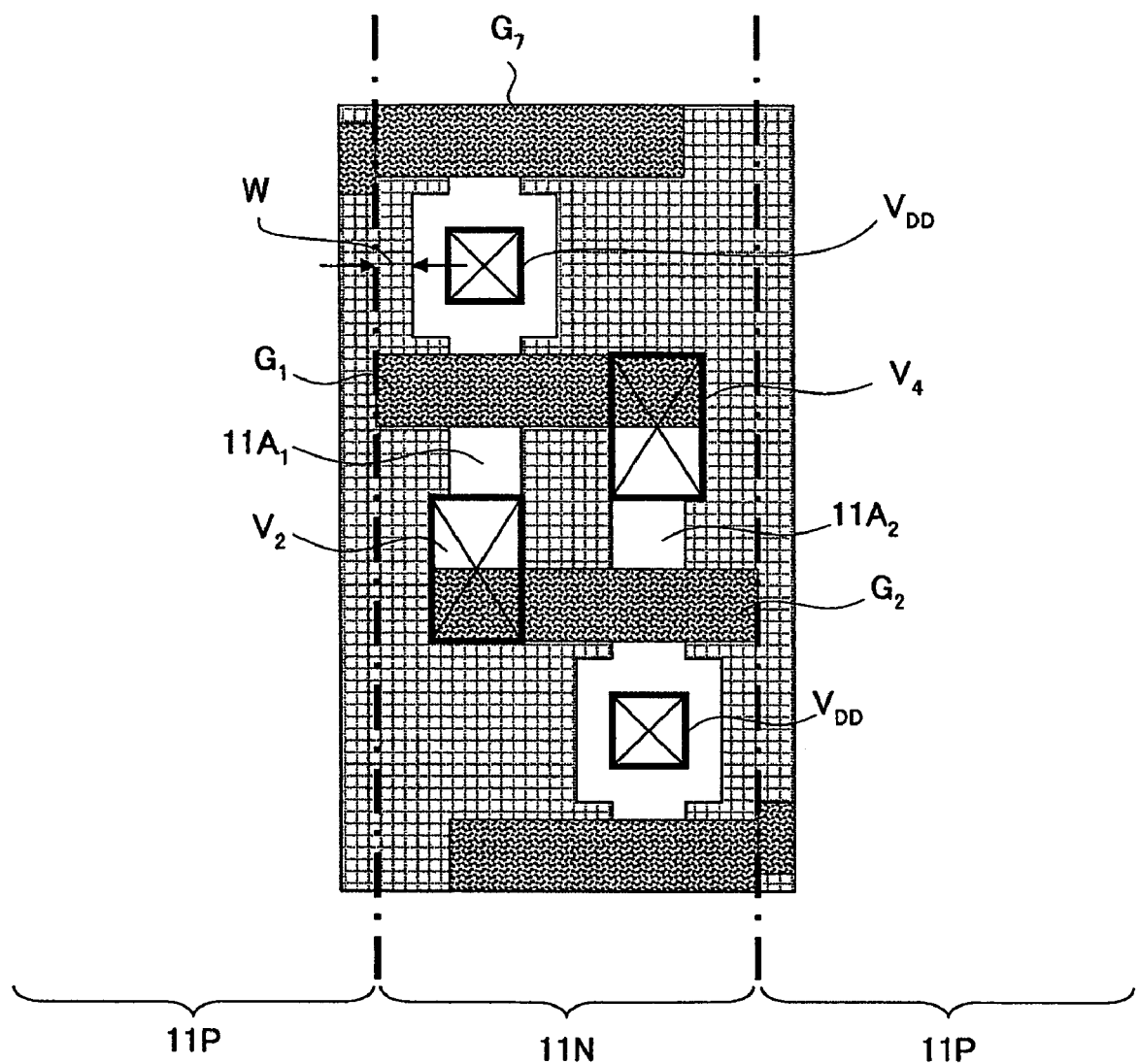
FIG. 10 is a diagram explaining the problems to be solved.

Meanwhile, the problem of change of characteristics of the load transistor caused by the positional offset of the via-plug 15A explained with reference to FIG. 5B is caused by the lack of margin of positional alignment, which in turn is caused as a result of excessive miniaturization of the SRAM such that the width of the device region $11A_1$ is now smaller than the diameter of the via-plug as explained with reference to FIG. 5C. Thus, one may be tempted to the solution as shown in FIG. 10 to expand the width of the device region $11A_1$ or $11A_2$ in the vicinity of the via-contact $V_{DD}$. Here, FIG. 10 is a diagram extracting the n-well part including the device regions $11A_1$ and $11A_2$ from the layout of FIG. 2.

However, such a construction cannot be used in practice. As shown in FIG. 10, the n-type device region $11A_1$ comes too close to the adjacent p-type well with such a construction. In view of the fact that the contact $V_{DD}$ is applied with the supply voltage, there is a substantial risk that the SRAM causes malfunctioning.

Figure 11:
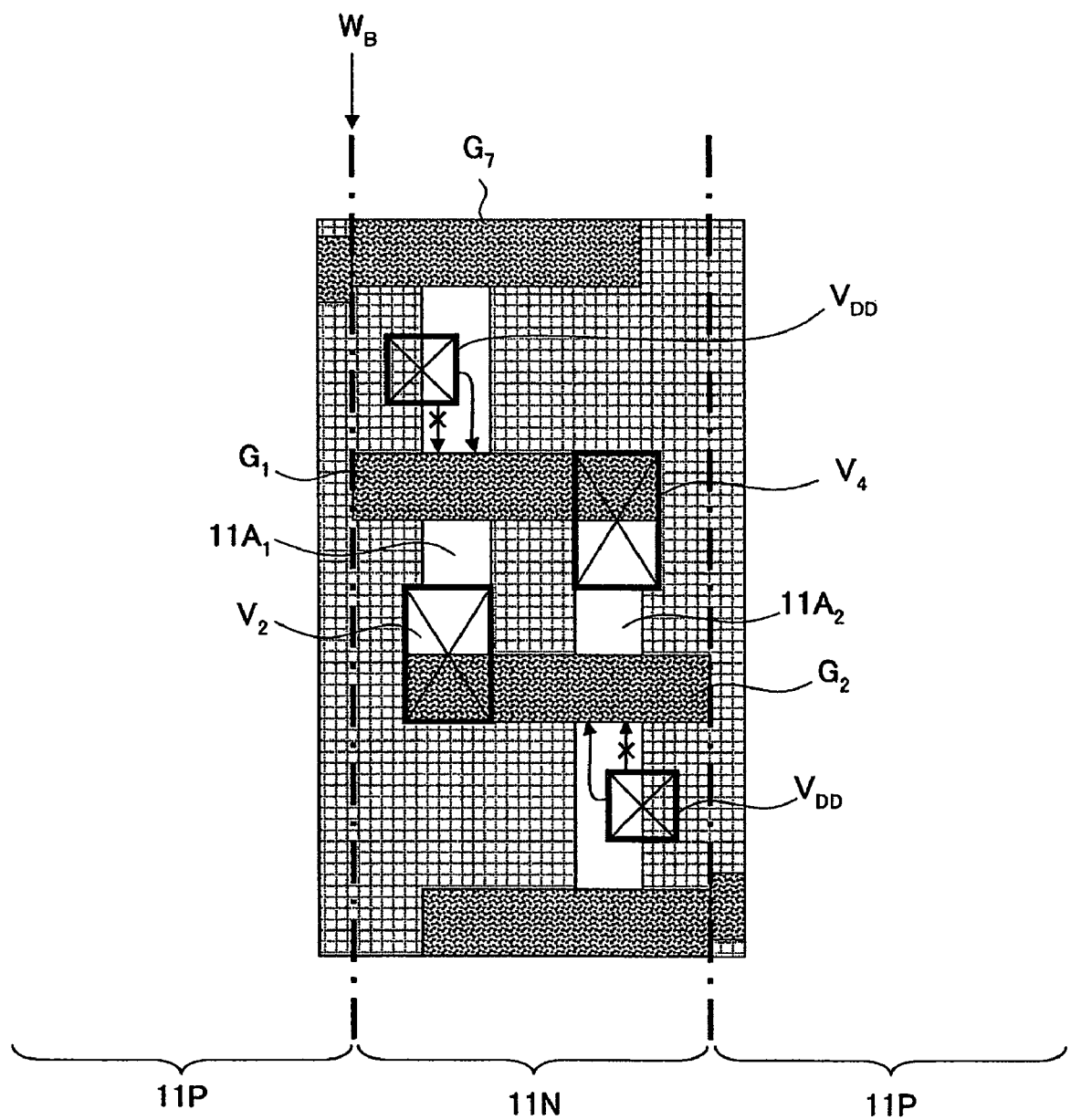
FIG. 11 is a diagram showing the construction of an SRAM according to a second embodiment.

On the other hand, FIG. 11 is a diagram showing the layout of an SRAM according to a second embodiment. In FIG. 11, those parts explained before are designated by the same reference numerals and the description thereof will be omitted.

Referring to FIG. 11, it should be noted that the present embodiment does not increase the width of the device regions $11A_1$ and $11A_2$ in correspondence to the via-contact $V_{DD}$ as in the case of the layout of FIG. 10 but displaces the via-contact $V_{DD}$ in one direction.

With such a construction, it is possible to avoid the problem of degradation of the transistor characteristics caused by the increase of source resistance explained before, even in the case the via-contact $V_{DD}$ is displaced and comes closer to the gate electrode $G_1$ or $G_2$ and the carrier flowing from the via-contact $V_{DD}$ to the channel of the load transistor is blocked as represented in FIG. 11 by x, in view of the fact that the carrier can flow along the path not blocked even in such a situation. Further, because sufficient distance is secured between the n-type device region $11A_1$ and the adjacent p-type well, there arises no problem of degradation of breakdown voltage. In FIG. 11, it should be noted that the exposed parts of the device regions $11A_1$ and $11A_2$ shown in blank are actually covered with a silicide layer.

Figure 12:
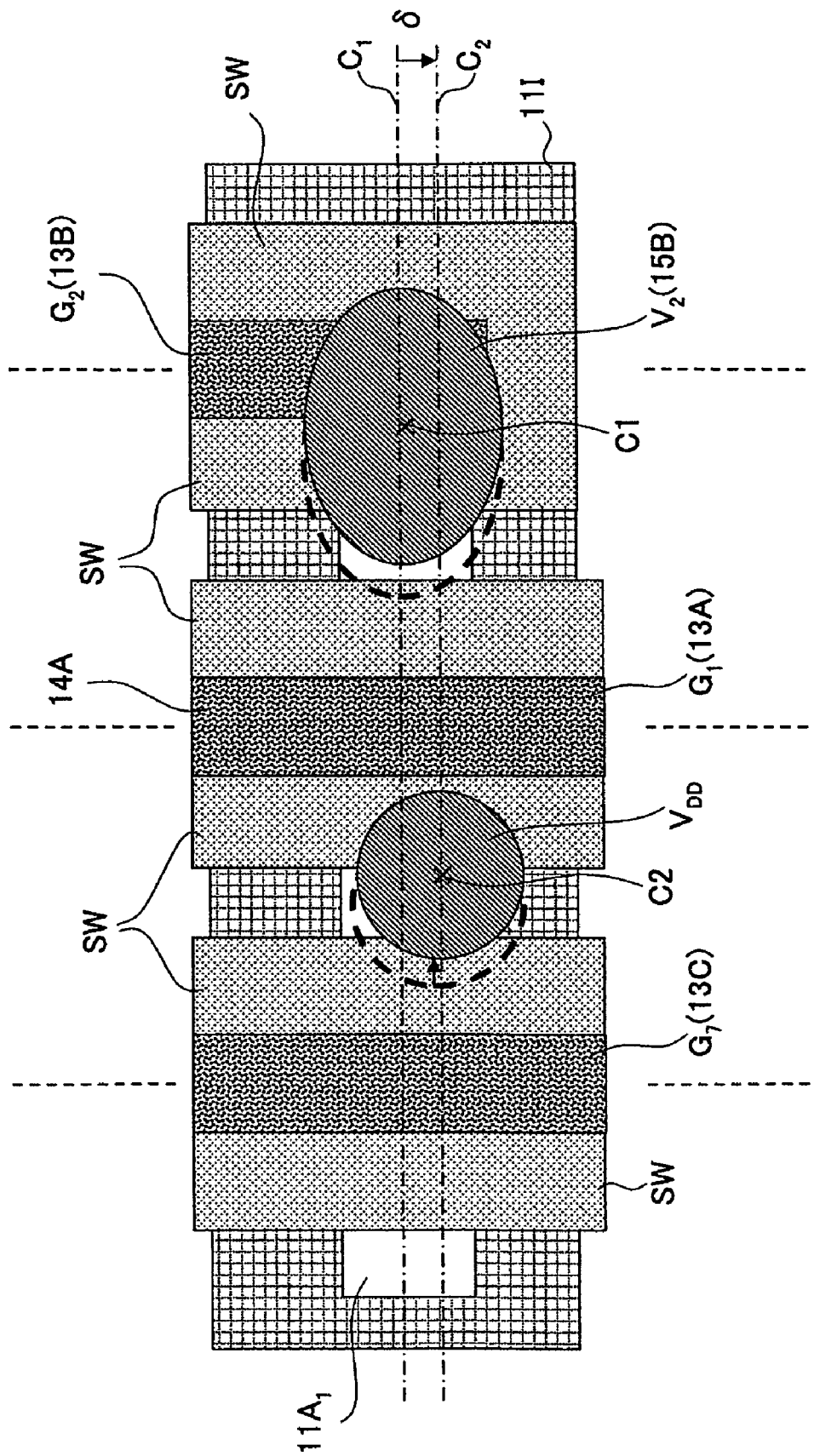
FIG. 12 is a diagram showing the construction of an SRAM according to a second embodiment.

FIG. 12 shows the device region $11A_1$ of FIG. 11 in a plan view.

Referring to FIG. 12, each of the polysilicon pattern 13C that corresponds to the gate electrode $G_7$, the polysilicon pattern 13A that corresponds to the gate electrode $G_1$ and the polysilicon pattern 13B that corresponds to the gate electrode $G_2$ carries the sidewall insulation films SW thereon and extends across the device region $11A_1$, wherein it can be seen that the via-plug 15A constituting the via-contact $V_{DD}$ is formed between the polysilicon pattern 13A and 13C such that the via-plug 15A is located between a pair of the sidewall insulation films SW. Further, the sidewall insulation film SW is removed locally at the side of the polysilicon pattern 13B facing the polysilicon pattern 14A, and the via-plug 15B constituting the via-contact $V_2$ connects the polysilicon pattern 13B to the device region $11A_1$.

In FIG. 12, too, the exposed part of the device region $11A_1$ shown by blank is covered with a silicide film such as $CoSi_2$ or NiSi.

Figure 13A:
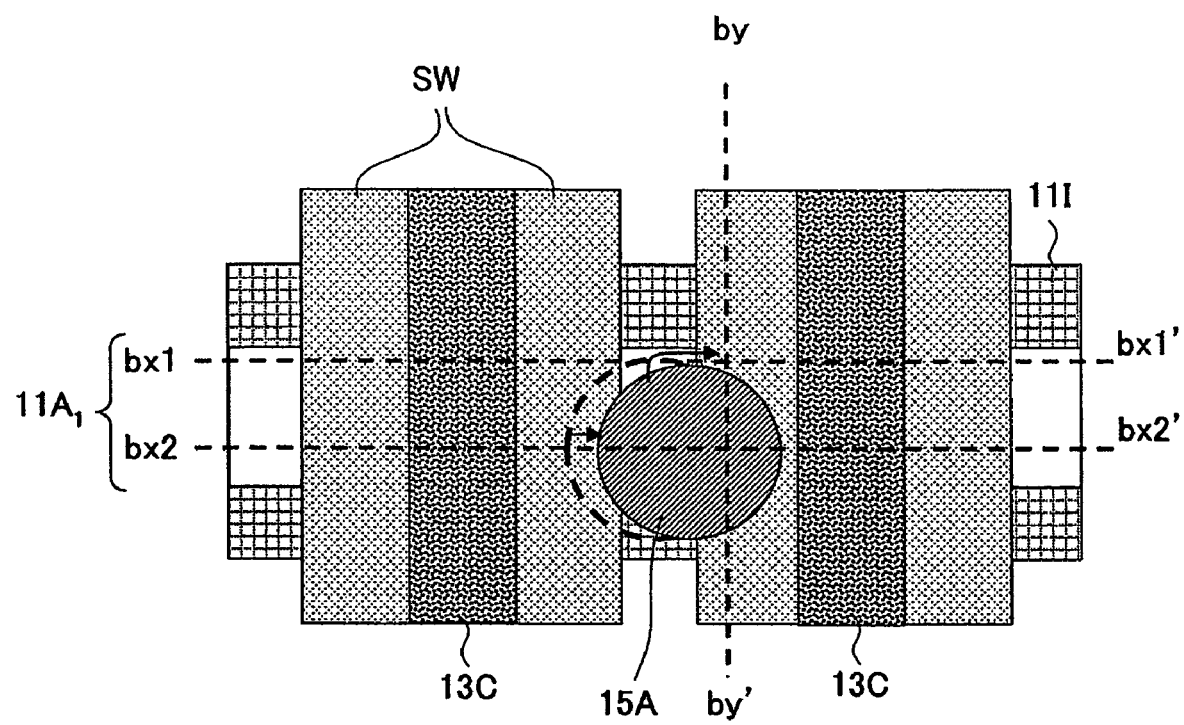
FIGS. 13A-13D are diagrams showing the construction of the SRAM according to the second embodiment.
Figure 13B:
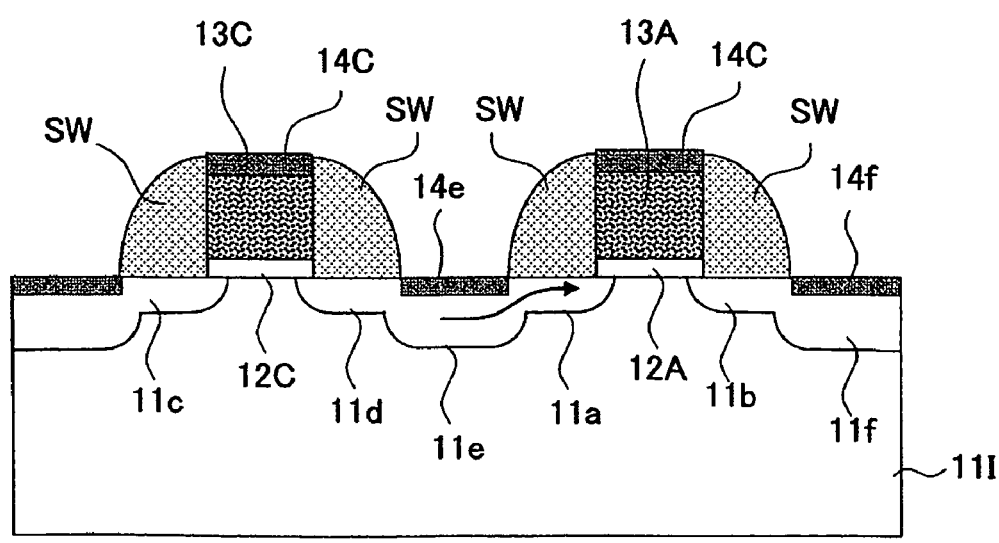
Figure 13C:
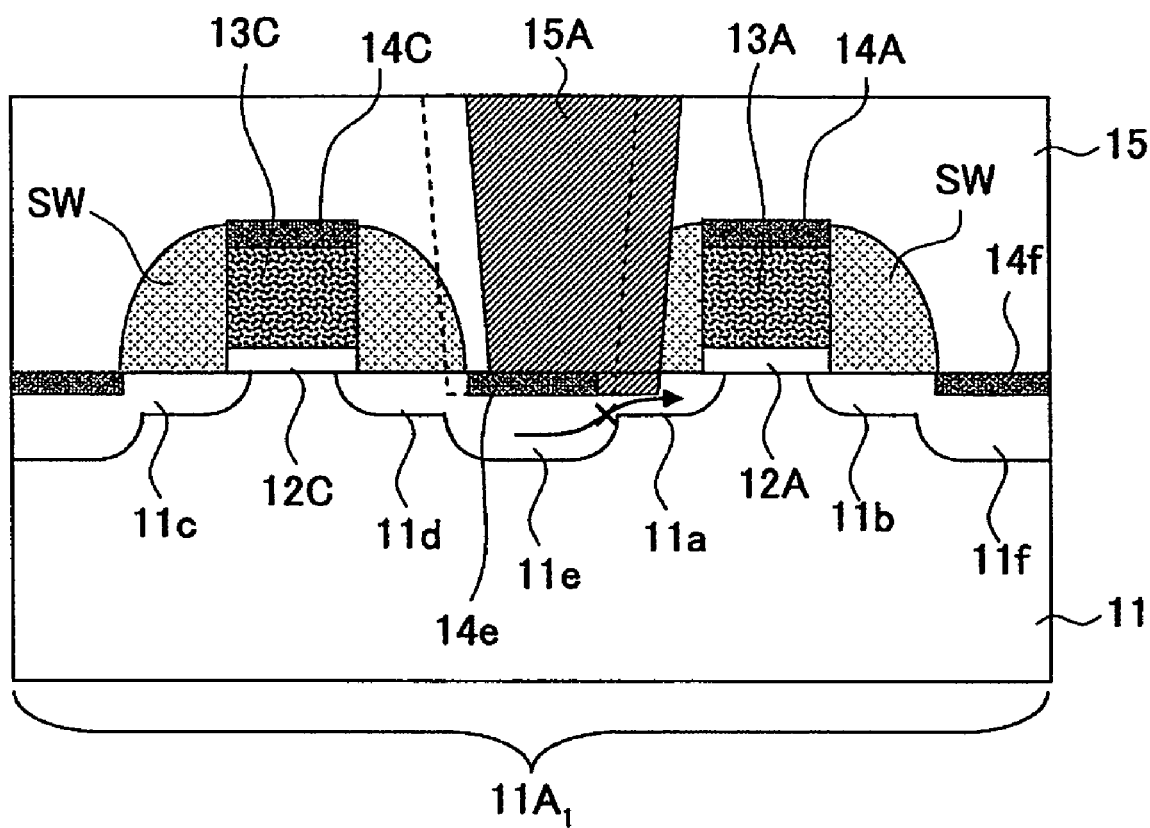
Figure 13D:
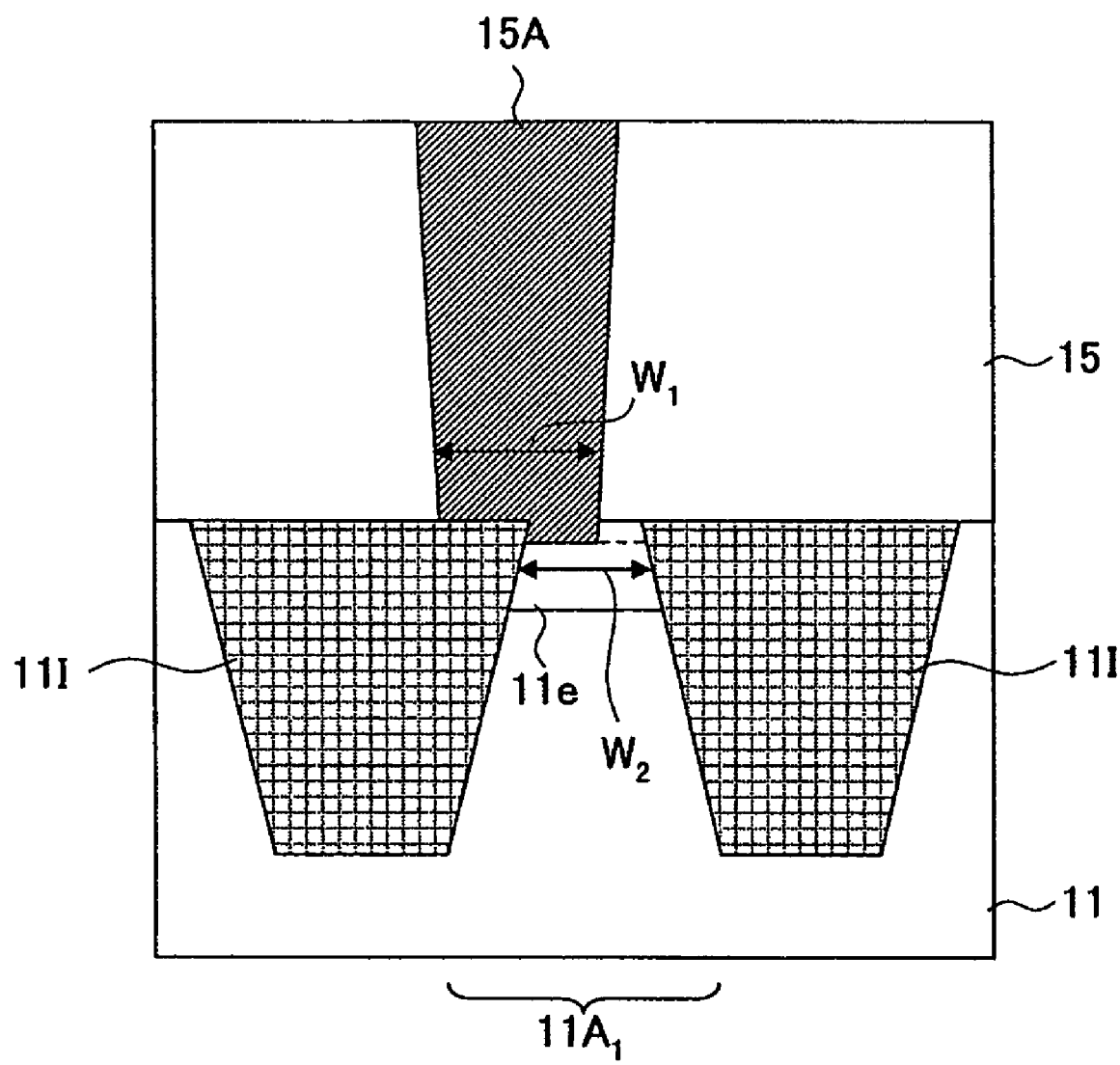

FIG. 13A is a plan view extracting a part of FIG. 12 in the vicinity of the via-contact $V_{DD}$, and hence the contact plug 15A, FIG. 13B is a cross-sectional diagram taken along a line bx1-bx1' shown in FIG. 13A, FIG. 13C is a cross-sectional diagram taken along a line bx2-bx2' in FIG. 13A, and FIG. 13D is a cross-sectional diagram taken along a line by1-by1' in FIG. 13A.

Referring to FIGS. 13A-13C, it can be seen in the cross-sectional diagram of FIG. 13C taken along the line bx2-bx2' that there is formed a structure similar to that of FIG. 5B, and thus, there is caused an increase of source resistance for the load transistor that has the polysilicon gate electrode 13A as a result of restriction of the path of the carriers injected into the channel region as represented in FIG. 13C by x. On the other hand, with the cross-section taken along the line bx1-bx1', it can be seen that the via-plug 15A is offset from the plane of the cross-section, and the carriers are injected efficiently into the channel region from the source region 11e into the channel region right underneath the gate electrode pattern 14C.

In the present embodiment, too, the via-plug 15A has a diameter. $W_1$ larger than the width $W_2$ of the device region 11A1 ($W_1 > W_2$) as shown in the cross-section of FIG. 13D. For example, the via-plug 15A may have the diameter of about 100 nm at the bottom end part thereof while the device region 11A$_1$ only has the width of about 70 nm. $_1$Even in such a case, it is possible to secure a width of about 10 nm for the path of the carriers circumventing the via-plug 15A by displacing the via-plug 15A at a central line $c_2$ thereof by 25 nm with respect to a central line $c_1$ of the device region 11A$_1$ by 25 nm (5=25 nm in FIG. 12).

In the present embodiment, too, the part of the device regions 11A$_1$ and 11A$_2$ in FIGS. 11 and 12 is covered with a silicide film except for the parts covered by the via-plugs 15A and 15B that the via-contacts $V_{DD}$ and $V_2$ or by the polysilicon patterns 13A-13C constituting the gate electrodes $G_1$, $G_2$ and $G_7$ including the sidewall insulation films SW thereof.

While the present embodiment has displaced the via-contact $V_{DD}$ to the side of a well boundary WB between the n-type well 11N and the p-type well 11P as shown in FIG. 11, it is also possible to displace the via-contact $V_{DD}$ in the direction away from the well boundary WB.

[Third Embodiment]

Figure 14:
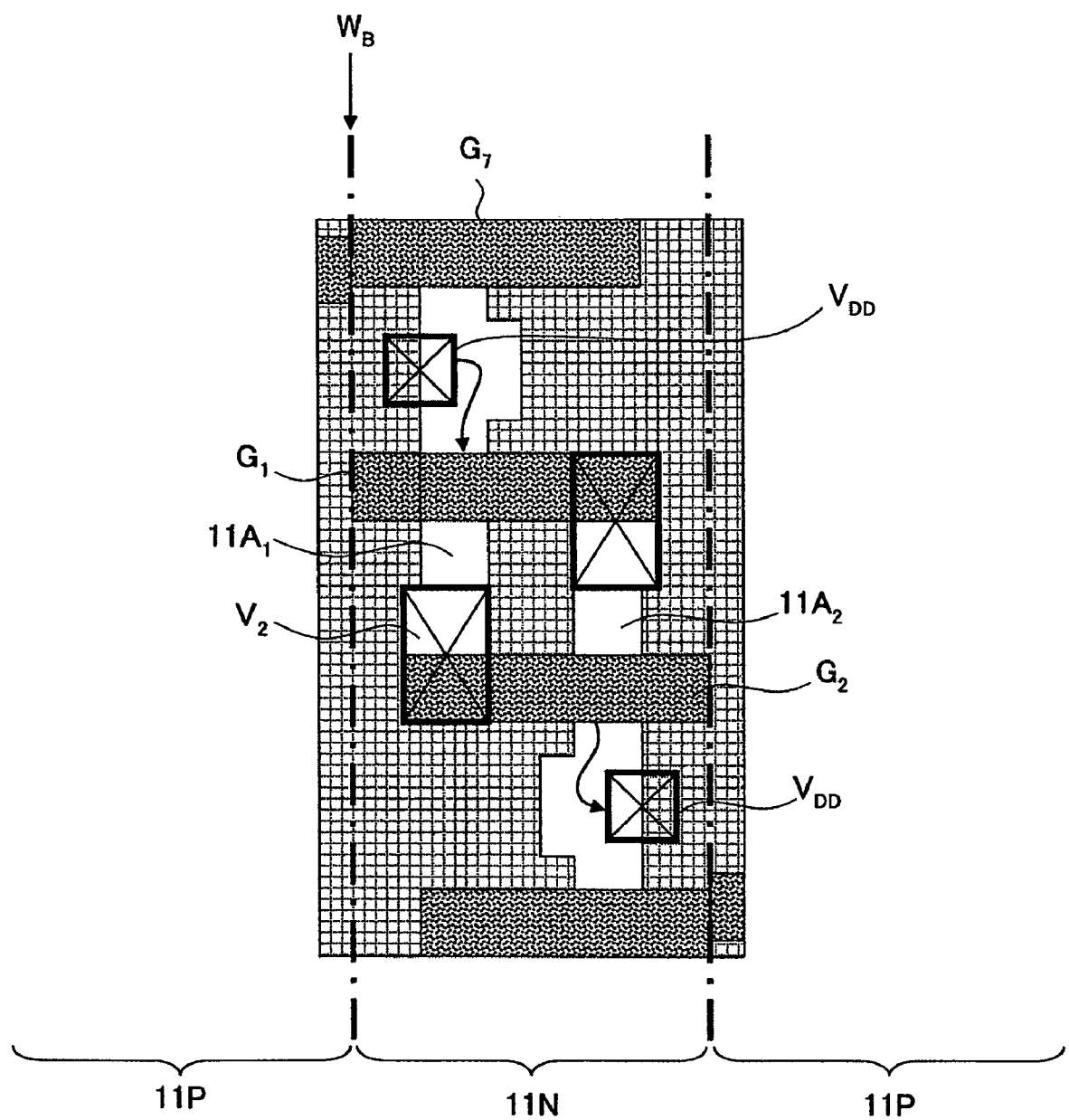
FIG. 14 is a diagram showing the construction of an SRAM according to a third embodiment.

FIG. 14 is a diagram showing the layout of an SRAM according to a third embodiment. In FIG. 14, those parts explained before are designated by the same reference numerals and the description thereof will be omitted.

Referring to FIG. 14, the present embodiment displaces one of the via-contacts $V_{DD}$ in one direction similarly to the layout of FIG. 11 and further expands the width of the device region 11A1 at the part where the via-contact $V_{DD}$ is formed in a direction away from the adjacent p-type well.

With such a construction, it is possible to avoid the problem of degradation of the transistor characteristics caused by the increase of source resistance explained before, even in the case the via-contact $V_{DD}$ is displaced and comes closer to the gate electrode $G_1$ or $G_2$ and the carrier flowing from the via-contact $V_{DD}$ to the channel of the load transistor is blocked as represented in FIG. 11 by x, in view of the fact that the carrier can flow along the path not blocked even in such a situation. Further, because sufficient distance is secured between the n-type device region 11A$_1$ and the adjacent p-type well, there arises no problem of degradation of breakdown voltage. Thereby, there is caused no problem of degradation of breakdown voltage in view of the fact that the width of the device region 11A$_1$ is expanded in the direction away from the well boundary WB shown in FIG. 14 by a one-dotted line.

In the present embodiment, too, the diameter $W_1$ of the via-plug 15A is larger than the width $W_2$ of the device region 11A$_1$ ($W_1 > W_2$), while it is possible to secure a width of about 30 nm for the carrier path circumventing the via-plug 15A by expanding the width of the device region 11A$_1$ by about 40 nm and displacing the central line $c_2$ of the via-plug 15A by 25 nm with regard to the central line c1 of the device region 11A$_1$.

In the present embodiment, too, the part of the device regions 11A$_1$ and 11A$_2$ in FIG. 14 is covered with a silicide film except for the parts covered by the via-plugs 15A and 15B that the via-contacts $V_{DD}$ and $V_2$ or by the polysilicon patterns 13A-13C constituting the gate electrodes $G_1$, $G_2$ and $G_7$ including the sidewall insulation films SW thereof.

Thus, with the second and third embodiments, the problem of increase of the source resistance associated with displacement of the contact is successfully avoided by securing the circumventing path of carriers around the via-contact $V_{DD}$. Thereby, it should be noted that sufficient effect is attained when such a circumventing path is provided with the width of 10-30 nm.

The conductivity type of p-type and n-type can be reversed in each of the foregoing embodiments.

While not specified, $CoSi_2$ or NiSi can used for the silicide layer.

What is claimed is:

1. A semiconductor memory device comprising:
   a semiconductor substrate; a first CMOS inverter comprising first and second MOS transistors having respective, mutually different channel conductivity types and connected in series at a first node on said semiconductor substrate;
   a second CMOS inverter comprising third and fourth MOS transistors having respective, mutually different channel conductivity types and connected in series at a second node on said semiconductor substrate, said second CMOS inverter forming, together with said first CMOS inverter, a flip-flop circuit;
   a first transfer transistor provided on said semiconductor substrate between a first bit line and said first node, said first transfer transistor having a first gate electrode connected to a word line and driven by a selection signal on said word line;
   a second transfer transistor provided on said semiconductor substrate between a second bit line and said second node, said second transfer transistor having a second gate electrode connected to said word line and driven by a selection signal on said word line;
   a polysilicon resistance element formed on a device isolation region on said semiconductor substrate,
   each of said first and third MOS transistors being formed in a device region of a first conductivity type defined in said semiconductor substrate by said device isolation region,
   each of said first and third MOS transistors comprising:
   a polysilicon gate electrode formed on said semiconductor substrate via a gate insulation film; gate sidewall insulation films formed at respective sidewall surfaces thereof; a second conductivity type source region formed in said semiconductor substrate at a first side of said polysilicon gate electrode such that an end part of said second conductivity type source region invades into a part of said semiconductor substrate right underneath said polysilicon gate electrode; a second conductivity type drain extension region formed in said semiconductor substrate at a second side opposite to said first side of said polysilicon gate electrode such that an end part of said second conductivity type drain extension region invades into said part of said semiconductor substrate right underneath said polysilicon gate electrode; and a second conductivity type drain region formed in said semiconductor substrate at an outer side of said gate sidewall insulation film of said second side in overlapping with said drain extension region, said second conductivity type drain region having a depth deeper than a depth of said second conductivity type drain extension region,
   said source region being formed directly underneath said sidewall insulation film provided to said gate electrode at said sidewall surface facing said source region and having a depth deeper that said drain extension region, said polysilicon gate electrode having a film thickness identical to a film thickness of said polysilicon resistance element, said source region and said polysilicon resistance element being doped with the same dopant element.

2. The semiconductor memory device as claimed in claim 1, wherein said source region has an impurity concentration level higher than an impurity concentration level of said drain extension region.

3. The semiconductor memory device as claimed in claim 1, wherein said source region is formed with a depth deeper than any of said drain extension region and said drain region.

4. The semiconductor memory device as claimed in claim 1, wherein there extends a polysilicon pattern constituting a gate electrode of the other of said first and third MOS transistors on said device isolation region in close proximity of said drain region, a first via-plug makes a contact to said source region via a first silicide layer, a second via-plug makes a contact to said drain region via a second silicide layer, third and fourth via-plugs make a contact with first and second regions of said polysilicon resistance element via third and fourth silicide layers, respectively, wherein said second via-plug makes a contact with a top surface of said polysilicon pattern via a fifth silicide layer and further to a sidewall surface of said polysilicon pattern at a side facing said polysilicon gate electrode.

* * * * *